(12) United States Patent
Orhan et al.

(10) Patent No.: US 11,444,645 B2
(45) Date of Patent: Sep. 13, 2022

(54) LOW POWER MMWAVE RECEIVER ARCHITECTURE WITH SPATIAL COMPRESSION INTERFACE

(71) Applicant: APPLE INC., Cupertino, CA (US)

(72) Inventors: Oner Orhan, San Jose, CA (US);
Hosein Nikopour, San Jose, CA (US);
Peter Sagazio, Portland, OR (US);
Farhana Sheikh, Hillsboro, OR (US);
Junyoung Nam, Sunnyvale, CA (US);
Shilpa Talwar, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/958,813

(22) PCT Filed: Jan. 2, 2018

(86) PCT No.: PCT/US2018/012066
§ 371 (c)(1),
(2) Date: Jun. 29, 2020

(87) PCT Pub. No.: WO2019/135733
PCT Pub. Date: Jul. 11, 2019

(65) Prior Publication Data
US 2021/0075456 A1     Mar. 11, 2021

(51) Int. Cl.
*H04B 1/16* (2006.01)
(52) U.S. Cl.
CPC ..................... *H04B 1/16* (2013.01)
(58) Field of Classification Search
CPC ........ H04B 1/16; H04B 7/0413; Y02D 30/70; H03M 7/70; H03M 7/30
See application file for complete search history.

(56) References Cited

U.S. PATENT DOCUMENTS

2014/0079112 A1\* 3/2014 Ranson ................ H04B 7/0413
375/240
2014/0098681 A1 4/2014 Stager et al.
(Continued)

FOREIGN PATENT DOCUMENTS

CN    106101739 A    11/2016
CN    107018099 A     8/2017
(Continued)

OTHER PUBLICATIONS

3GPP; "Service Requirements for the 5G system"; 3rd Generation Partnership Project; Technical Specification Group Serves and System Aspects; 3GPP TS 22.261 V15.0.0; Mar. 2017.
(Continued)

*Primary Examiner* — Yuwen Pan
*Assistant Examiner* — Fatuma G Sherif
(74) *Attorney, Agent, or Firm* — Eschweiler & Potashnik, LLC

(57) ABSTRACT

A receiver circuit associated with a communication device is disclosed. The receiver circuit comprises a digital data compression circuit configured to receive a plurality of digital receive signals derived from a plurality of analog receive signals respectively associated with the receiver circuit. The digital data compression circuit is further configured to compress the plurality of digital receive signals to form one or more compressed digital data signals based thereon, to be provided to an input output (I/O) interface associated therewith. In some embodiments, a compressed digital signal dimension associated with the one or more compressed digital data signals is less than a digital signal dimension associated with the plurality of digital receive signals.

14 Claims, 9 Drawing Sheets

(56) References Cited

U.S. PATENT DOCUMENTS

| | | | |
|---|---|---|---|
| 2015/0031411 A1* | 1/2015 | Jung | H04B 1/401 |
| | | | 455/553.1 |
| 2015/0063495 A1 | 3/2015 | Qu | |
| 2015/0222687 A1 | 8/2015 | Brown | |
| 2015/0380005 A1* | 12/2015 | Chesney | G10L 19/005 |
| | | | 704/500 |
| 2016/0021567 A1 | 1/2016 | Agiwal | |
| 2016/0142922 A1* | 5/2016 | Chen | H04W 16/28 |
| | | | 375/267 |
| 2016/0337255 A1 | 11/2016 | Balasubramanian et al. | |
| 2017/0180017 A1 | 6/2017 | Wang | |
| 2017/0373707 A1* | 12/2017 | Suzuka | H04H 20/63 |

FOREIGN PATENT DOCUMENTS

| | | |
|---|---|---|
| JP | 2014196957 A | 10/2014 |
| WO | 2016/185823 A1 | 11/2016 |

OTHER PUBLICATIONS

Gibson, Jerry; "Information Theory and Rate Distortion Theory for Communications and Compression," Morgan & Claypool, 2013.

CPRI Specification V6.1 , "Common Public Radio Interface (CPRI)", Jul. 2014.

O'Mahony, Frank et al.; "The Future of Electrical I/O for Microprocessors" 2009 International Symposium on VLSI Design, Automation and Test, Hsinchu, 2009.

Si, Hongbo et al.; "A Novel and Efficient Vector Quantization Based CPRI Compression Algorithm," in IEEE Transactions on Vehicular Technology, No. 99; Oct. 16, 2015.

International Search Report dated Oct. 5, 2018 for International Application No. PCT/US2018/012066.

International Preliminary Report on Patentability dated Jul. 7, 2020 for International Application No. PCT/US2018/012066.

3D mmWave Channel Model Proposal; Oct. 19, 2021.

MCC Support; Final Report of 3GPP TSG RAN WG1 #89 v1.0.0; 3GPP TSG RAN WG1 Meeting #90; R1-1712031; Aug. 21, 2017.

Joint Spatial Division and Multiplexing; https://www.researchgate.net/publication/230814965; Sep. 2012.

Joint Spatial Division and Multiplexing—The Large-Scale Array Regime; IEEE Transactions on Information Theory, vol. 59, No. 10; Oct. 2013.

T. A. Thomas, H. C. Nguyen, G. R. MacCartney, Jr., and T. S. Rappaport, "3D mmWave Channel Model Proposal," in Vehicular Technology Conference (VTC Fall), 2014 IEEE 80th, Sep. 14-17, 2014.

3-D millimeter-Wave Statistical Channel Model for 5G Wireless System Design; IEEE Transactions on Microwave Theory and Techniques, vol. 64, No. 7; Jul. 2016; pp. 2207-2225.

MIMO Channel Capacity and Modeling Issues on a Measured Indoor Radio Channel at 5.8 GHz; IEEE Transactions on Wireless Communications, vol. 4, No. 3; May 2005; pp. 895-903.

The Future of Electrical I/O for Microprocessors; Frank O'Mahony; https://pdfs.semanticscholar.org/b977/cd2c1ecd27cae9730c55c4562a91cc52eeab.pdf; Jul. 16, 2021, date of conference Apr. 28-30, 2009.

* cited by examiner

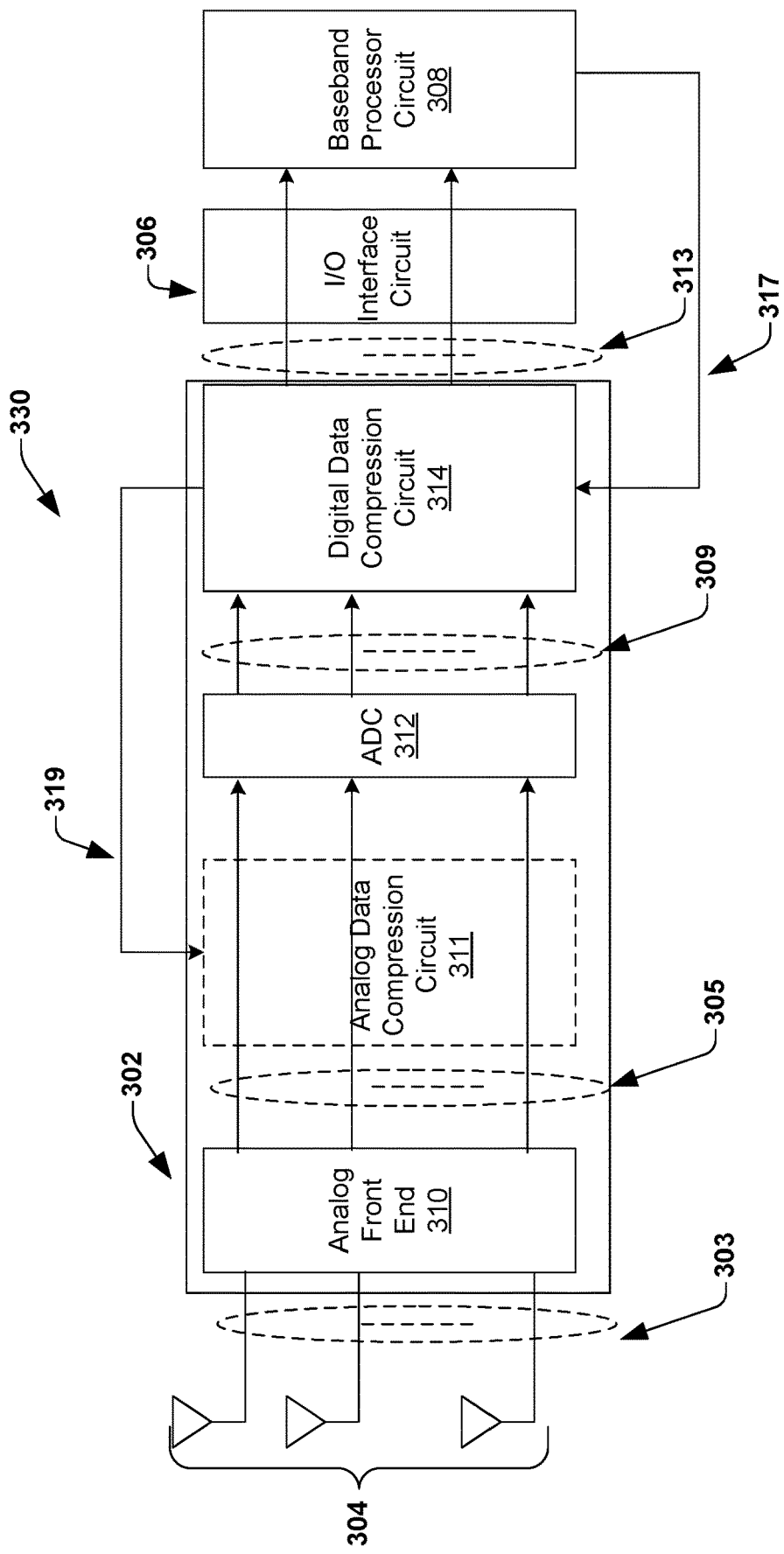

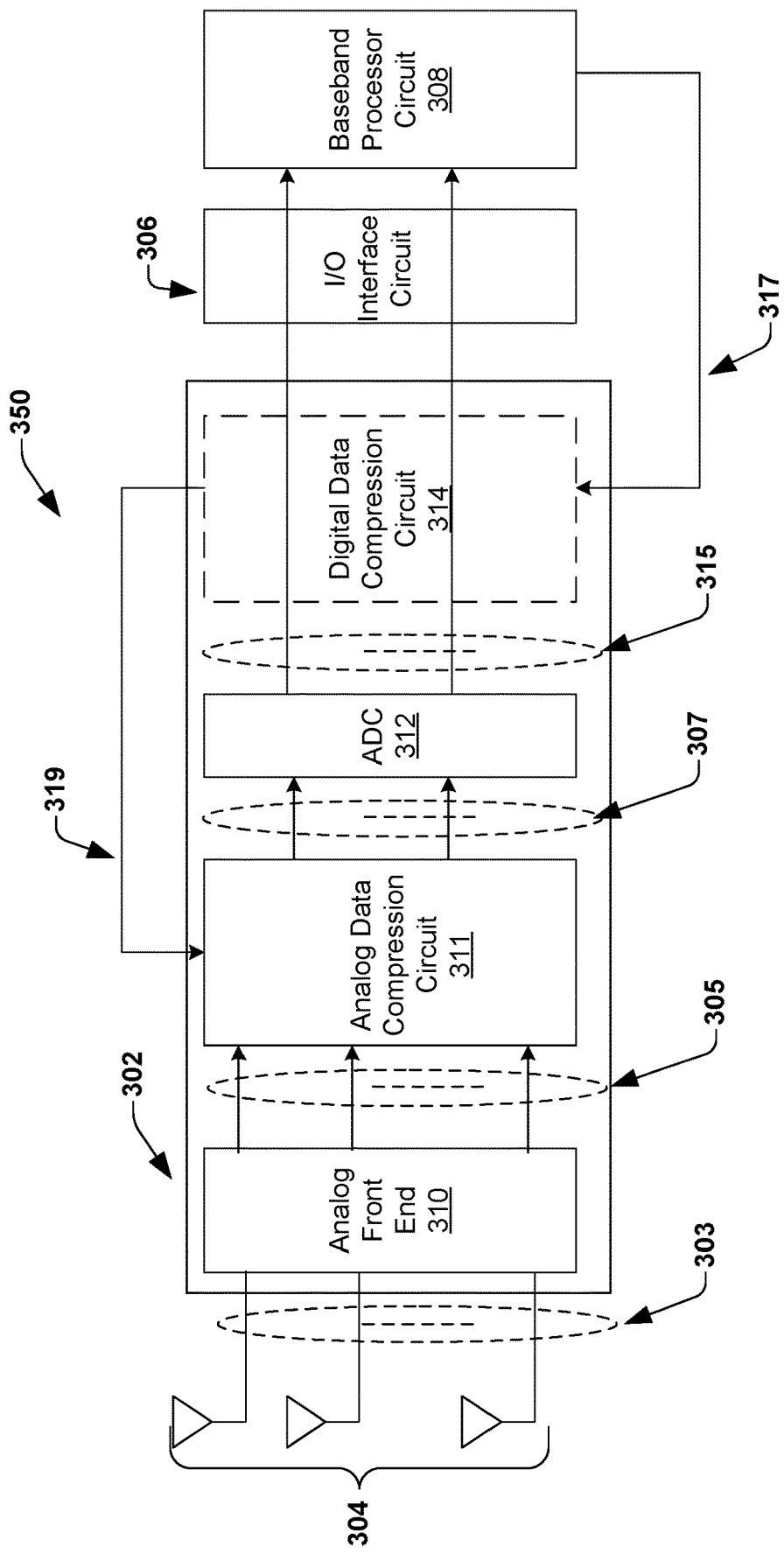

LOW POWER MMWAVE RECEIVER ARCHITECTURE WITH SPATIAL COMPRESSION INTERFACE

This application is a National Phase entry application of International Patent Application No. PCT/US2018/012066 filed Jan. 2, 2018, and is hereby incorporated by reference in its entirety.

FIELD

The present disclosure relates to receiver circuits in wireless communication systems, and more specifically to an apparatus and a method for applying spatial compression in receiver circuits.

BACKGROUND

The next generation (5G+) cellular system is envisioned to have 1000× more data traffic than current cellular systems. To realize 1000× data volume increase, use of new frequency bands, for example, millimeter wave bands (mmWave) and densification of the network, for example, ultra-dense networks (UDN) are two key enablers. Further, the next generation communication systems require high data rates, low latency, and high reliability. To support the above features, the next generation communication systems require wide bandwidth and high throughput mmWave receiver architectures. Further, the radio frequency (RF) front-end of the wide bandwidth and high throughput mmWave receivers require high-bandwidth and high rate input output (I/O) interfaces to deliver data to baseband peripherals such as processor and memory. However, the power dissipation of the wide bandwidth and high throughput (I/O) interfaces greatly affect the power efficiency of the mmWave receivers.

BRIEF DESCRIPTION OF THE DRAWINGS

Some examples of circuits, apparatuses and/or methods will be described in the following by way of example only. In this context, reference will be made to the accompanying Figures.

FIG. 3a illustrates an example implementation of a digital mode of operation of the receiver circuit in FIG. 3, according to one embodiment of the disclosure.

FIG. 3b illustrates an example implementation of a hybrid mode of operation of the receiver circuit in FIG. 3, according to one embodiment of the disclosure.

DETAILED DESCRIPTION

Figure 1:
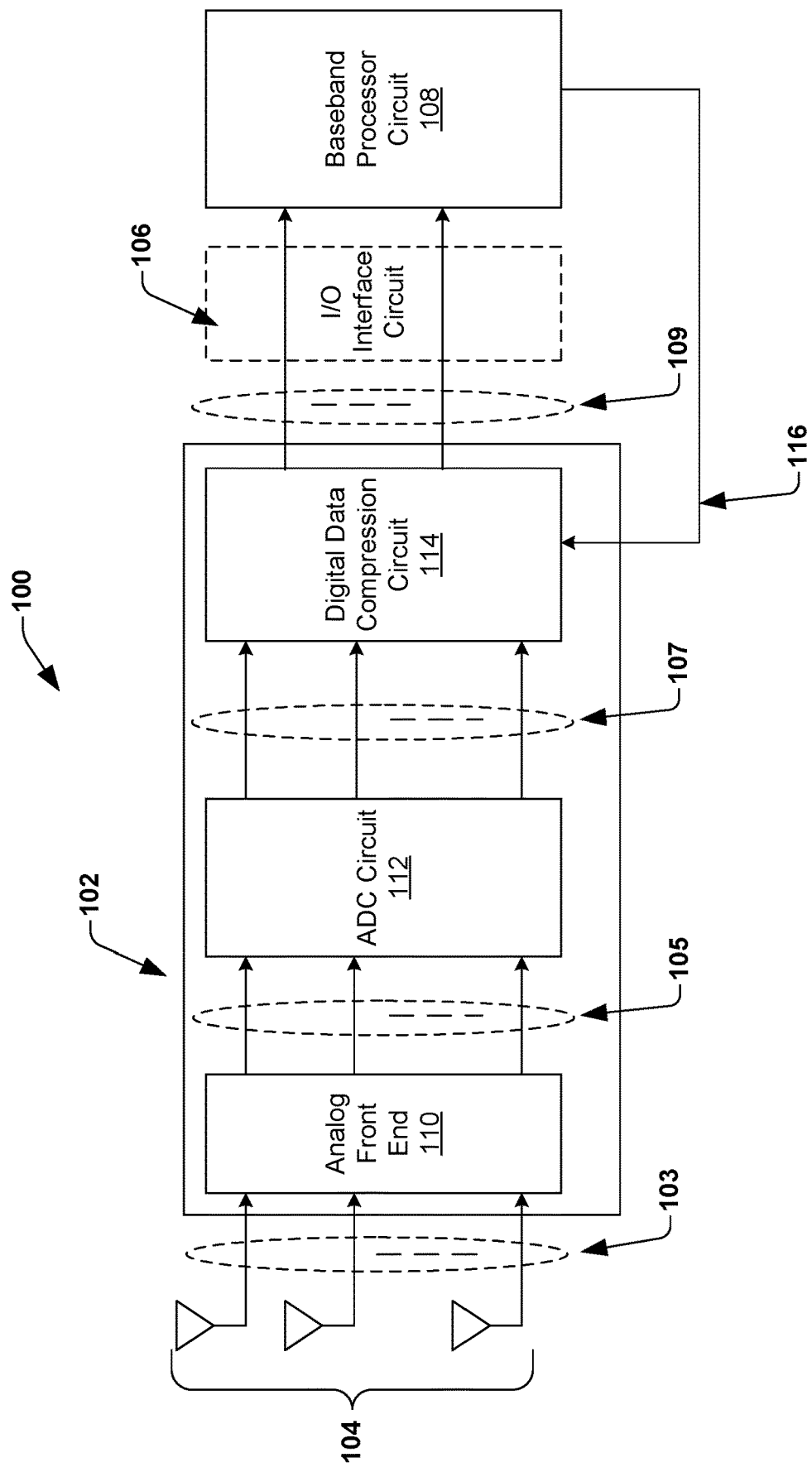
FIG. 1 illustrates a simplified block diagram of a receiver circuit, according to one embodiment of the disclosure.

In one embodiment of the disclosure, a receiver circuit associated with a communication device is disclosed. The receiver circuit comprises a digital data compression circuit configured to receive a plurality of digital receive signals derived from a plurality of analog receive signals associated with the receiver circuit, respectively. In some embodiments, the digital data compression circuit is further configured to compress the plurality of digital receive signals to form one or more compressed digital data signals based thereon, to be provided to an input output (I/O) interface associated therewith. In some embodiments, a compressed digital signal dimension associated with the one or more compressed digital data signals is less than a digital signal dimension associated with the plurality of digital receive signals.

In one embodiment of the disclosure, a method for a receiver circuit is disclosed. The method comprises receiving, at a digital data compression circuit, a plurality of digital receive signals respectively derived from a plurality of analog receive signals associated with the receiver circuit. The method further comprises compressing, at the digital data compression circuit, the plurality of digital receive signals to form one or more compressed digital data signals based thereon, to be provided to an input output (I/O) interface associated therewith. In some embodiments, a compressed digital signal dimension associated with the one or more compressed digital data signals is less than a digital signal dimension associated with the plurality of digital receive signals.

In one embodiment of the disclosure, a receiver circuit associated with a communication device is disclosed. The receiver circuit comprises a digital data compression circuit configured to receive a plurality of digital receive signals derived from the plurality of analog receive signals associated with the receiver circuit and determine a data compression metric based on the plurality of digital receive signals, during a digital mode associated with the receiver circuit. In some embodiments, the digital data compression circuit is further configured to compress the plurality of digital receive signals to form one or more compressed digital data signals to be provided to an input output (I/O) interface circuit associated therewith, based on a data compression metric, during the digital mode. In some embodiments, a compressed digital signal dimension associated with the one or more compressed digital data signals is less than a digital signal dimension associated with the plurality of digital receive signals. In some embodiments, the compressed digital signal dimension is dictated by the data compression metric.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, the radio frequency (RF) front-end of the wide bandwidth and high throughput mmWave receivers require high-bandwidth and high rate input output (I/O) interfaces to deliver data to baseband peripherals such as processor and memory. In typical implementations of the wide bandwidth and high throughput I/O interfaces, the power consumption is quite high, thereby greatly affecting the power efficiency of the mmWave receivers. Therefore, in order to improve the efficiency of mmWave receivers, the power consumption associated with the wide bandwidth and high throughput I/O interfaces has to be reduced. Existing implementations of mmWave receivers utilize different methods to reduce the power consumption associated with the wide bandwidth and high throughput I/O interfaces.

For example, in some existing implementations of the receivers, a common packet radio interference (CPRI) method that provides the removal of redundancy in the spectral domain, block scaling, and quantization resolution optimization is utilized. Further, in some other existing implementations of the receivers, an analog beamforming method that provides a compression of analog receive signals from a massive number of Rx antennas to a limited number receive signals, thereby reducing the receive chains (and the I/O chains) associated with the receiver, is utilized. In some embodiments, the analog beamforming relies on phase shifters which apply a phase shift to receive signals and combine them in analog domain to reduce the number of receive chains. Furthermore, in some other existing implementations of the receivers, a bit level compression method that utilizes vector quantization, and entropy coding, in order to reduce redundancy in the data.

However, the CPRI and the bit level compression methods do not account for the received signal correlation and the sparsity of the mmWave channel, and does not provide spatial compression. Due to small wavelength of mmWave frequencies, mmWave receiver has large number of antennas. Therefore, reducing dimension of received signal with spatial compression is very important to reduce baseband computational complexity and to reduce the number of I/O links. Further, even though the analog beamforming method provides spatial compression, analog beamforming has limited control over the spatial compression since it relies on phase-only weights at the received signal which makes it difficult to implement adaptive beamforming, and usually compression vectors are selected from predefined codebook. Further, phase shifters rely on sector sweeping which increases the initial access latency in analog beamforming.

In order to overcome the above disadvantages, an apparatus and a method to implement a flexible spatial and digital compression in receiver circuits (e.g., mmWave receivers) is proposed in this disclosure. In particular, a receiver architecture having a spatial compression block in digital domain, in order to reduce dimension of channel (or receive chains) using properties of mmWave channel (sparsity, directionality) is proposed herein. In some embodiments, the idea behind reducing the dimension of the channel is to select a set of receive signals having significant strength (e.g., having receive power greater than a predefined threshold) from a plurality of receive signals associated with the receiver circuit, so that the same information can be retrieved using the lesser number of signals. In some embodiments, reducing the dimension of the channel will reduce the requirement on the number of I/O links, thereby reducing the power consumption associated with the I/O links. In addition, having spatial compression will help to increase signal-to-noise ratio (SNR) which will reduce channel estimation error. Another benefit of the spatial compression block at the receiver is the reduction at the computational complexity of baseband processing per receive (Rx) antenna such as equalization. In some embodiments, implementing spatial compression in digital domain further enables to eliminate the sector sweeping latency involved in analog beamforming.

FIG. 1 illustrates a simplified block diagram of a receiver circuit 100, according to one embodiment of the disclosure. In some embodiments, the receiver circuit 100 can be part of a wireless communication device. In some embodiments, the receiver circuit 100 facilitates to provide spatial compression of receive signals, thereby enabling to reduce the number of input output (I/O) links associated with the receiver circuit 100. In some embodiments, reducing the number of I/O links enables to improve the power efficiency of the receiver circuit 100. In some embodiments, the spatial compression of the receive signals in the receiver circuit 100 is performed solely in digital domain. However, in some other embodiments, the spatial compression of the receive signals in the receiver circuit 100 is performed partly in the digital domain and partly in the analog domain.

The receiver circuit 100 comprises a front-end circuit 102, a baseband processor circuit 108 and an input output (I/O) interface circuit 106. In some embodiments, the front-end circuit 102 may be implemented as part of a radio frequency (RF) integrated circuit (IC) and the baseband processor circuit 108 is implemented as part of a baseband (BB) IC. The front-end circuit 102 further comprises an analog front-end circuit 110, an analog-to-digital converter circuit 112 and a digital data compression circuit 114. The analog front-end circuit 110 is configured to receive a plurality of receive signals 103 from a plurality of antennas 104 respectively associated with the analog front-end circuit 110 and generate a plurality of analog receive signals 105 based thereon. In some embodiments, the plurality of analog receive signals 105 is a processed version (e.g., down-converted, filtered) of the plurality of receive signals 103. In some embodiments, the plurality of analog receive signals 105 comprises an analog signal dimension N associated therewith. In some embodiments, the analog signal dimension N refers to a number of analog receive signals in the plurality of analog receive signals 105. In some embodiments, the analog signal dimension N is dictated by a number of antennas in the plurality of antennas 104. The ADC circuit 112 is coupled to the analog front-end circuit 110 and configured to digitize the plurality of analog receive signals 105 to generate a plurality of digital receive signals 107, respectively from the plurality of analog receive signals 105. In some embodiments, the plurality of digital receive signals 107 comprises a digital signal dimension S associated therewith. In some embodiments, the digital signal dimension S refers to a number of digital receive signals in the plurality of digital receive signals 107. In some embodiments, the digital signal dimension S is equal to the analog signal dimension N.

The digital data compression circuit 114 is coupled to the ADC circuit 112 and configured to compress the plurality of digital receive signals 107 to generate one or more compressed digital data signals 109 based thereon. In some embodiments, the one or more compressed digital data signals 109 comprises a compressed digital signal dimension K associated therewith. In some embodiments, the compressed digital signal dimension K refers to a number of compressed digital data signals in the one or more compressed digital data signals 109. In some embodiments, the compressed digital signal dimension associated with the one or more compressed digital data signals 109 is less than a digital signal dimension associated with the plurality of digital receive signals 107. Therefore, in such embodiments, the digital data compression circuit 114 provides spatial compression of the plurality of digital receive signals 107. In some embodiments, the digital data compression circuit 114 is further configured to provide the one or more compressed digital data signals 109 to the input output (I/O) interface circuit 106. In some embodiments, the I/O interface circuit 106 comprises one or more I/O links and is configured to convey the one or more compressed digital receive signals 109 to the baseband processor circuit 108 for further processing. In some embodiments, reducing the dimension of the plurality of digital receive signals 107 to form the one or more compressed digital data signals 109 enables to reduce the number of I/O links utilized within the I/O interface circuit 106, thereby reducing the power consumption of the I/O interface circuit 106.

In some embodiments, the digital data compression circuit 114 is configured to generate the one or more compressed digital data signals 109 based on a compression operation that utilizes a data compression metric D, on the plurality of digital receive signals 107. In some embodiments, the data compression metric D facilitates to reduce a signal dimension associated with the plurality of digital receive signals 107. In some embodiments, the data compression metric D dictates the compressed digital signal dimension K associated with the one or more compressed digital data signals 109. In some embodiments, the digital data compression circuit 114 is further configured to quantize the one or more compressed digital data signals 109, prior to providing the one or more compressed digital data signals 109 to the I/O interface circuit 106. In some embodiments, equation (1) below depicts one possible way of implementing the compression operation within the digital data compression circuit 114.

$$r[n]=Q(Dy[n]) \qquad (1)$$

Where $r[n]$ is the one or more compressed digital data signals 109, Q is a quantization operation implemented within the digital data compression circuit 114, D is the data compression metric and $y[n]$ is the plurality of digital receive signals 107. In some embodiments, the quantization operation Q(.) is applied to the compressed digital data signals 109, in order to reduce the total delivered bits to the baseband processor circuit 108.

Due to the compression operation given in equation (1) above, in some embodiments, $r[n]$ will have a reduced dimension compared to $y[n]$. For example, $r[n]$ will have a dimension of K and $y[n]$ will have a dimension of S, where K<S, as indicated above. In some embodiments, the digital data compression circuit 114 is further configured to determine the data compression metric D, prior to compressing the plurality of digital receive signals 107. In some embodiments, the data compression metric D comprises a digital compression matrix D comprising a plurality of entries. In some embodiments, the digital data compression circuit 114 is configured to determine the data compression metric D, at least in part, based on one or more measurements associated with the plurality of digital signals 107. In some embodiments, a dimension of the digital compression matrix D is dictated by the digital signal dimension S and the required compressed signal dimension K. For example, in some embodiments as indicated above, the plurality of digital receive signals 107 $y[n]$ comprises a digital signal dimension S associated therewith. In some embodiments, each of the digital receive signals in the plurality of digital receive signals 107 $y[n]$ at the output of the ADC circuit 112 comprises an in-phase component and a quadrature component associated therewith. Therefore, in such embodiments, the ADC circuit 112 is configured to feed 2S quantized digital samples comprising the in-phase component and the quadrature component associated with the plurality of digital receive signals 107 to the digital data compression circuit 114.

Further, as indicated above, one or more compressed digital data signals 109 $r[n]$ has a compressed signal dimension K associated therewith. In some embodiments, each of the compressed digital data signals in the plurality of compressed digital data signals 109 comprises an in-phase component and a quadrature component associated therewith. Therefore, in some embodiments, the plurality of compressed digital data signals 109 comprises 2K compressed samples. In order to compress the 2S quantized digital samples associated with the plurality of digital receive signals 107 into the 2K compressed samples, in some embodiments, a digital compression matrix D of size 2K×2S (K<S) is utilized in equation (1) above. In some embodiments, the digital compression matrix D can be implemented as given in equation (2) below:

$$D = \begin{bmatrix} d_{1,1} & \cdots & d_{1,2S} \\ \vdots & \ddots & \vdots \\ d_{2K,1} & \cdots & d_{2K,2S} \end{bmatrix} \quad (2)$$

In some embodiments, the digital data compression circuit 114 is further configured to adaptively change the data compression metric D, based on a feedback signal 116 from the baseband processor circuit 108. In some embodiments, the digital data compression circuit 114 is configured to adaptively change the data compression metric D during predetermined intervals of time, for example, for every frame, super-frame etc. In some embodiments, a super frame comprises a plurality of frames. In some embodiments, a length of a super frame depends on the dynamics of a channel. In some embodiments, the receiver circuit 100 comprises a fully digital receiver where data compression occurs only in the digital domain, as explained above (e.g., within the digital data compression circuit 114). However, in some embodiments, the receiver circuit 100 can be configured to operate in two different modes, for example, a digital mode and a hybrid mode. In order to facilitate both the modes, the receiver 100 may be implemented in a mixed architecture, wherein the receiver circuit 100 may be configured to be selectively operated in the digital mode and the hybrid mode. During the digital mode, data compression is carried out in the digital domain (e.g., within the digital data compression circuit 114) as explained above. Further, in the hybrid mode, the data compression is carried out in the analog domain. Therefore, in such embodiments, the receiver circuit 100 may comprise an analog data compression circuit (not shown) coupled between the analog front-end circuit 110 and the ADC circuit 112, in order to implement the data compression in the analog domain, further details of which are given in an embodiment below. In some embodiments, for example, in mixed architecture, the digital data compression circuit 114 is activated only during the digital mode and the analog data compression circuit is activated only during the hybrid mode.

The data compression metric D can be determined differently in different embodiments. In some embodiments, the data compression metric D is determined, at least in part, based on measurements associated with the plurality of digital receive signals 107 (which in turn is indicative of the plurality of receive signals 103). In one example embodiment, the data compression metric D is computed based on an Rx correlation matrix method, the details of which are given below. In some embodiments, this method determines the data compression metric D, based on determining the receive signal correlation. Consider a virtual channel representation (VCR) channel model given by $$H = F_{rx} H_v F_{tx}{}^H \in C^{N \times M} \quad (3)$$

where $F_{rx}$, $F_{tx}$ are DFT matrices, and $H_v$ is a virtual channel matrix coupling virtual Tx and Rx directions. N and M are the number of Rx and Tx antennas (or antenna ports, beam patterns), respectively. This channel model is regarded to work very well especially for the case of a large number of antennas with uniform linear/planar arrays. Let $H(t)f_{tx,j}$ denote the j-th beamformed pilot signal, where $f_{tx,j}$ is an arbitrary beamforming vector, i.e., not restricted to a column of DFT matrix. The notion of Rx correlation matrix is generally valid under the Kronecker channel model. From the perspective of VCR, however, a similar quantity is derived, which is referred to herein as a "virtual" Rx correlation matrix. Having the VCR model in mind, we compute $$v_i = \frac{1}{MT} \sum_{t=1}^{T} \sum_{j=1}^{M} |f_{rx,i}^H H(t) f_{tx,j}|^2 \quad (4)$$

where T is the time/frequency window for moving average, $f_{rx,i}{}^H$ is t'th receiver beamforming vector, we have i=1, . . . , N receiver beamforming vector, $f_{tx,i}{}^H$ is j'th transmitter beamforming vector, we have j=1, . . . , M receiver beamforming vector, H(t) is channel at time t, and measurements are done over time T and $v_i$ is average receive power when the direction is $f_{rx,i}{}^H$ and transmitter is doing beam sweeping with transmitter beamforming vectors $f_{tx,i}{}^H$, j=1, . . . , M. If $v_i$ is the highest, then i'th receiver beamforming captures the strongest receiver path. In some embodiments, $f_{rx,i}{}^H$ and $f_{tx,i}{}^H$ are Eigen directions computed from Rx correlation matrix. However, if we consider virtual channel representation, these are vectors selected from column of DFT matrices since these Eigen directions can be approximated with column of DFT matrices.

Now a subset of [i:N] is determined such that $i \in S_1$ if $v_i > E$, where E is a predefined threshold. All virtual RX directions in $S_1$ can be regarded as non-negligible ones. Finally, compression matrix is computed as given below:

$$D = \{f_{rx,i}^H\}_{i \in S_1} \in C^{|S_1| \times N} \quad (5)$$

where D is the data compression matrix. In some embodiments, $S_1$ corresponds to the number of significant receive signals out of the N receive signals. In some embodiments, the data compression matrix D is derived in such a way that the data compression matrix D enables to reduce the N number of receive signals to S1 signals. In some embodiments, S1 corresponds to the compressed signal dimension (e.g., the compressed signal dimension K above). The compression efficiency of the above approach depends on the sparsity ($|S_1|$) of dominant long-term virtual Rx channel directions. Equation (5) is just one possible way of deriving the data compression matrix D. However, other possible ways of deriving D are also contemplated to be within the scope of this disclosure. For example, in another example embodiment, columns of the data compression matrix D are derived from a predefined codebook. In such embodiments, an exhaustive search based on a given criterion (for example, receive (Rx) power) may be performed to define D based on available codewords of the predefined codebook.

Figure 2:
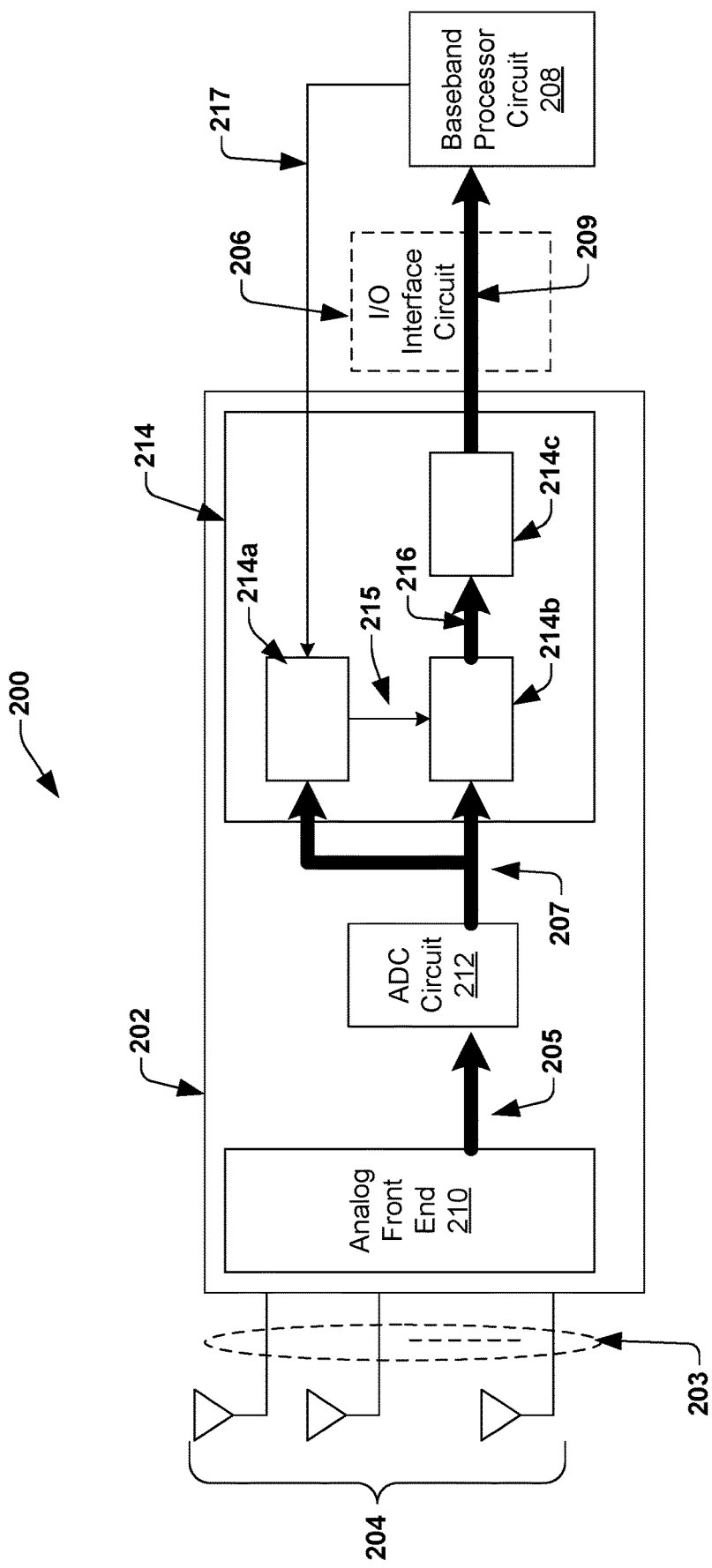
FIG. 2 illustrates an example implementation of a receiver circuit, according to one embodiment of the disclosure.

FIG. 2 illustrates an example implementation of a receiver circuit 200, according to one embodiment of the disclosure. In some embodiments, the receiver circuit 200 depicts one possible way of implementation of the receiver circuit 100 in FIG. 1 above. In this embodiment, the receiver circuit 200 comprises a fully digital architecture, wherein the receiver circuit 200 is configured to implement data compression only in the digital domain. However, other possible ways of implementation of the receiver circuit 100 are also contemplated to be within the scope of this disclosure. The receiver circuit 200 comprises a front-end circuit 202, a baseband processor circuit 208 and an input output (I/O) interface circuit 206. In some embodiments, the front-end circuit 202 is implemented as part of a radio frequency (RF) integrated circuit (IC) and the baseband processor circuit 208 is implemented as part of a baseband IC. The front-end circuit 202 further comprises an analog front-end circuit 210, an analog-to-digital converter circuit 212 and a digital data compression circuit 214. The analog front-end circuit 210 is configured to receive a plurality of receive signals 203 from a plurality of antennas 204 respectively associated with the analog front-end circuit 210 and generate a plurality of analog receive signals 205 based thereon. In FIG. 2, a single block arrow is utilized to depict the plurality of analog receive signals 205 as well as other signals for the ease of reference. The single block arrow is indicative of one or more signals and the single block arrow is not to be construed as a single signal throughout the disclosure.

In some embodiments, the plurality of analog receive signals 205 is a processed version (e.g., down-converted, filtered) of the plurality of receive signals 203. In some embodiments, the plurality of analog receive signals 205 comprises an analog signal dimension N associated therewith. In some embodiments, the analog signal dimension N refers to a number of analog receive signals in the plurality of analog receive signals 205. In some embodiments, the analog signal dimension N is dictated by the number of antennas in the plurality of antennas 204. The ADC circuit 212 is coupled to the analog front-end circuit 210 and is configured to digitize the plurality of analog receive signals 205 to generate a plurality of digital receive signals 207, respectively from the plurality of analog receive signals 205. In some embodiments, the plurality of digital receive signals 207 comprises a digital signal dimension S associated therewith. In some embodiments, the digital signal dimension S refers to a number of digital receive signals in the plurality of digital receive signals 207. In some embodiments, the digital signal dimension S is equal to the analog signal dimension N.

The digital data compression circuit 214 is coupled to the ADC circuit 212 and configured to compress the plurality of digital receive signals 207 to generate one or more compressed digital data signals 209 based thereon. In some embodiments, the one or more compressed digital data signals 209 comprises a compressed digital signal dimension K associated therewith. In some embodiments, the compressed digital signal dimension K refers to a number of compressed digital data signals in the one or more compressed digital data signals 209. In some embodiments, the compressed digital signal dimension K associated with the one or more compressed digital data signals 209 is less than a digital signal dimension S associated with the plurality of digital receive signals 207. In some embodiments, the digital data compression circuit 214 is configured to generate the one or more compressed digital data signals 209 based on a compression operation that utilizes a data compression metric D, on the plurality of digital receive signals 207. In some embodiments, the data compression metric D facilitates to reduce a signal dimension associated with the plurality of digital receive signals 207. In some embodiments, the data compression metric D dictates the compressed digital signal dimension K associated with the one or more compressed digital data signals 209.

In some embodiments, the digital data compression circuit 214 comprises a compression parameter determination circuit 214a, a compression circuit 214b and a quantization circuit 214c. In some embodiments, the compression parameter determination circuit 214a is configured to receive the plurality of digital receive signals 207 and determine the data compression metric D based thereon. In some embodiments, the data compression metric D comprises a data compression matrix D as given in equation (2) above. In some embodiments, the data compression matrix D has a of size $2K \times 2S$ (K<S), where 2S accounts for the in-phase and quadrature components associated with the plurality of digital receive signals 207 and 2K accounts for the in-phase and quadrature components associated with the one or more compressed digital data signals 209, as explained above with respect to FIG. 1. In some embodiments, the data compression metric D is determined at the compression parameter determination circuit 214a based on one of the methods explained above (e.g., the codebook based method, covariance matrix method etc.) with respect to FIG. 1, utilizing one or more measurements associated with the plurality of digital receive signals 207. However, other methods of determining the data compression metric D are also contemplated to be within the scope of this disclosure.

In some embodiments, the data compression metric D is assumed to be determined at the compression parameter determination circuit 214a in real-time during a receive operation associated with the receiver circuit 200. However, in other embodiments, the data compression metric D can be assumed to be determined before the receive operation, within the compression parameter determination circuit 214a or outside, and stored in a memory circuit associated with the compression parameter determination circuit 214a. For example, in some embodiments, the compression parameter determination circuit 214a can comprise a lookup table comprising one or more values of the D matrix (for example, determined based on the codebook method), stored within the compression parameter determination circuit 214a, prior to the receive operation. In such embodiments, the compression parameter determination circuit 214a can be configured to select a D matrix from the plurality of D matrices, in order to perform the compression operation, during the receive operation of the receiver circuit 200.

In some embodiments, the compression parameter determination circuit 214a is further configured to adaptively change the data compression metric D based on a feedback signal 217 from the baseband processor, or one or more measurements associated with the plurality of digital receive signals 207 (e.g., receive power, angle of arrival etc.), or both. In some embodiments, the compression parameter determination circuit 214a is configured to adaptively change the data compression metric D during predetermined intervals of time, for example, for every frame or super frame, associated with the plurality of receive signals 203. In some embodiments, the compression parameter determination circuit 214a is configured to adaptively change the data compression metric D during preamble times of the frames or super frames associated with the plurality of receive signals 203.

Upon determining the data compression metric D, the compression parameter determination circuit 214a is configured to provide the data compression metric D to the compression circuit 214b. In some embodiments, the compression parameter determination circuit 214a can be configured to generate a compression parameter signal 215 comprising the data compression metric D and provide the compression parameter signal 215 to the compression circuit 214*b*, in order to provide the data compression metric D to the compression circuit 214*b*. The compression circuit 214*b* is configured to receive the data compression metric D from the compression parameter determination circuit 214*a* and the plurality of digital receive signals 207 from the ADC circuit 212, and compress the plurality of digital receive signals 207 based on the data compression metric D, to form one or more compressed signals 216.

The quantization circuit 214*c* is coupled to the compression circuit 214*b* and is configured to receive the one or more compressed signals 216. The quantization circuit 214*b* is further configured to quantize the one or more compressed signals 216 to generate the one or more compressed digital data signals 209. In some embodiments, the one or more compressed digital data signals 209 is a quantized version of the one or more compressed signals 216. In some embodiments, the quantization operation applied to the compressed signals 216 enables to reduce the total delivered bits to baseband processor circuit 208. In some embodiments, the compression circuit 214*b* and the quantization circuit 214*b* is configured to implement the compression operation given in equation (1) above. In some embodiments, quantization of the one or more compressed signals 216 within the quantization circuit 214*b* is an optional step. Therefore, in such embodiments, the one or more compressed digital data signals 209 can be equivalent to the one or more compressed signals 216. In some embodiments, the quantization circuit 214*b* is further configured to provide the one or more compressed digital data signals 209 to the I/O interface circuit 206. In some embodiments, the I/O circuit 209 comprises a plurality of I/O links configured to convey the one or more compressed digital data signals 209 to the baseband processor circuit 208.

Figure 3:
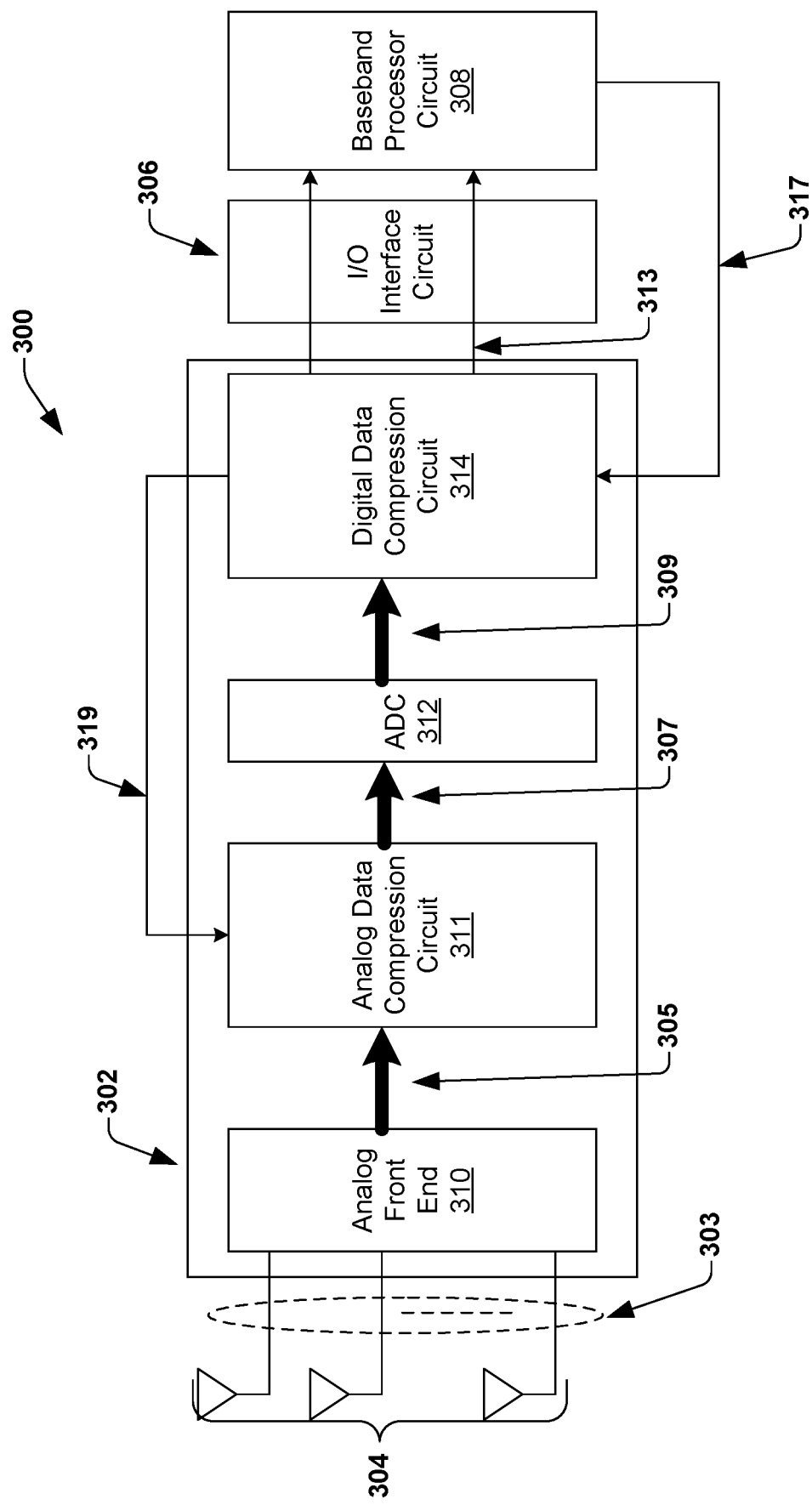
FIG. 3 illustrates an example implementation of a receiver circuit, according to one embodiment of the disclosure.

FIG. 3 illustrates an example implementation of a receiver circuit 300, according to one embodiment of the disclosure. In some embodiments, the receiver circuit 300 depicts another possible way of implementation of the receiver circuit 100 in FIG. 1 above. In this embodiment, the receiver circuit 300 comprises a mixed architecture, wherein the receiver circuit 300 is configured to implement data compression both in digital domain and in analog domain. However, other possible ways of implementation of the receiver circuit 100 are also contemplated to be within the scope of this disclosure. The receiver circuit 300 comprises a front-end circuit 302, a baseband processor circuit 308 and an input output (I/O) interface circuit 306. In some embodiments, the front-end circuit 302 is implemented as part of a radio frequency (RF) integrated circuit (IC) and the baseband processor circuit 308 is implemented as part of a baseband IC. The front-end circuit 302 further comprises an analog front-end circuit 310, an analog data compression circuit 311, an analog-to-digital converter circuit 312 and a digital data compression circuit 314.

In some embodiments, the front-end circuit 302 is configured to receive a plurality of receive signals 303 from a plurality of antennas 304 respectively associated with the front-end circuit 302 and generate a compression of the plurality of receive signals 303, in order to generate one or more compressed digital data signals 313. In some embodiments, the front-end circuit 302 is further configured to provide the one or more compressed digital data signals 313 to the I/O interface circuit 306, in order to convey the one or more compressed digital data signals 313 to the baseband processor circuit 308 for further processing. In some embodiments, the receiver circuit 300 is configured to operate in two modes, namely, a digital mode and a hybrid mode. In some embodiments, FIG. 3*a* depicts the digital mode of operation of the receiver circuit 300 in FIG. 3 and FIG. 3*b* depicts the hybrid mode of operation of the receiver circuit 300 in FIG. 3. During the fully digital mode, the compression of the plurality of receive signals 303 is configured to occur in digital domain and during the hybrid mode, the compression of the plurality of receive signals 303 is configured to occur in analog domain.

Therefore, in the digital mode, the compression of the plurality of receive signals 303 occurs within the digital data compression circuit 314 and in the hybrid mode, the compression of the plurality of receive signals 303 occurs within the analog data compression circuit 311 of FIG. 3. In some embodiments, in mixed architecture, the digital data compression circuit 314 is selectively activated during the digital mode as shown in FIG. 3*a* and selectively deactivated during the hybrid mode as shown in FIG. 3*b*. Similarly, the analog data compression circuit 311 is selectively activated during the hybrid mode as shown in FIG. 3*b* and selectively deactivated during the digital mode as shown in FIG. 3*a*. In some embodiments, the digital mode and the hybrid mode are respectively utilized/activated during predefined periods associated with the beamforming operation of the plurality of receive signals 303.

For example, in some embodiments, the digital mode is utilized during a long-term channel training phase associated with beamforming and the hybrid mode is utilized during a control/data modulation phase associated with beamforming. In some embodiments, the long-term channel training phase performs sync, initial access and beam tracking associated with a receive operation, and the control/data reception phase conducts short-term channel estimation and receive beamforming associated with the receive operation. In some embodiments, the digital mode is utilized during the long-term channel training phase, in order to determine a data compression metric D and perform the compression operation in the digital data compression circuit 314. Once the data compression metric D is determined, in some embodiments, the hybrid mode is utilized during the control/data modulation phase to perform the compression operation in the analog data compression circuit 311. In some embodiments, the data compression metric D determined within the digital data compression circuit 314 during the digital mode is provided to the analog data compression circuit 311, in order to perform the compression operation during the hybrid mode. In some embodiments, utilizing the digital mode to determine the data compression metric D enables to reduce sector sweeping latency associated with the analog domain (e.g., analog beamforming explained above). However, in other embodiments, other possible ways of operation of the receiver circuit 300 are also contemplated to be within the scope of this disclosure. For example, in some embodiments, the receiver circuit 300 can be configured to operate only in the digital domain. In some embodiments, the digital mode and the hybrid mode are configured to repeat at predetermined time intervals, and the digital data compression circuit 314 is configured to adaptively change the data compression metric D during the digital mode associated with each of the respective time intervals.

In some embodiments, the digital mode of operation of the receiver circuit 300 can be explained with reference to the receiver circuit 330 in FIG. 3*a*. In some embodiments, the receiver circuit 300 in FIG. 3 and the receiver circuit 330 in FIG. 3*a* are the same, and therefore, the same indexes are utilized to identify the various components and signals in FIG. 3 and FIG. 3a. Referring to FIG. 3a, it can be seen that in mixed architecture, during the digital mode, the digital data compression circuit 314 is selectively activated and the analog data compression circuit 311 is selectively deactivated. Upon deactivating the analog compression circuit 311, the receiver circuit 330 is similar to the fully digital receiver circuit 200 in FIG. 2. In some embodiments, the digital mode of operation of the receiver circuit 330 is similar to the operation of the receiver circuit 200 in FIG. 2 above. Referring again to FIG. 3a, the analog front-end circuit 310 is configured to receive a plurality of receive signals 303 from a plurality of antennas 304 respectively associated with the analog front-end circuit 310 and generate a plurality of analog receive signals 305 based thereon. In some embodiments, the plurality of analog receive signals 305 comprises an analog signal dimension N associated therewith. In some embodiments, the analog signal dimension N refers to a number of analog receive signals in the plurality of analog receive signals 305. In some embodiments, the analog signal dimension N is dictated by the number of antennas in the plurality of antennas 304.

Since the analog data compression circuit 311 is deactivated during the digital mode, the ADC circuit 312 in FIG. 3a is configured to receive the plurality of analog receive signals 305 and digitize the plurality of analog receive signals 305 to generate a plurality of digital receive signals 309, respectively from the plurality of analog receive signals 305. In some embodiments, the plurality of digital receive signals 309 comprises a digital signal dimension S associated therewith. In some embodiments, the digital signal dimension S refers to a number of digital receive signals in the plurality of digital receive signals 309. During the digital mode, the digital signal dimension S is equal to the analog signal dimension N, as there is no data compression within the analog domain. The digital data compression circuit 314 in FIG. 3a is coupled to the ADC circuit 312 and configured to compress the plurality of digital receive signals 309 to generate one or more compressed digital data signals 313 based thereon. In some embodiments, the one or more compressed digital data signals 313 comprises a compressed digital signal dimension K associated therewith. In some embodiments, the compressed digital signal dimension K refers to a number of compressed digital data signals in the one or more compressed digital data signals 313. In some embodiments, the compressed digital signal dimension K associated with the one or more compressed digital data signals 313 is less than a digital signal dimension S associated with the plurality of digital receive signals 309. In some embodiments, the digital data compression circuit 314 is further configured to provide the one or more compressed digital data signals 313 to the I/O interface circuit 306. In some embodiments, the I/O interface circuit 306 is further configured to convey the one or more compressed digital data signals 313 to the baseband processor circuit 308, for further processing.

In some embodiments, the digital data compression circuit 314 is configured to generate the one or more compressed digital receive signals 313 based on a compression operation that utilizes a data compression metric D, on the plurality of digital receive signals 309. In some embodiments, the data compression metric D dictates the compressed digital signal dimension K associated with the one or more compressed digital data signals 313. In some embodiments, the data compression metric D comprises a data compression matrix D having a size of 2K×2S, where 2K and 2S accounts for the in-phase and quadrature components associated with the plurality of compressed digital data signals 313 and the plurality of digital receive signals 309, respectively, as explained above with respect to FIG. 1. In some embodiments, the digital data compression circuit 314 is further configured to determine the data compression metric D, prior to performing the compression operation. In some embodiments, the digital data compression circuit 314 is configured to determine the data compression metric D based on the one or more methods explained above with respect to FIG. 1 above. In some embodiments, the digital data compression circuit 314 is further configured to adaptively change the data compression metric in real-time, based on a feedback signal 317 from the baseband processor circuit 308, or one or more measurements associated with the plurality of digital receive signals 309, or both, as explained above with respect to FIG. 2.

Upon determining the data compression metric D, in some embodiments, the digital data compression circuit 314 is further configured to generate a compression metric signal 319 comprising the data compression metric D and provide the compression metric signal 319 to the analog data compression circuit 311 or to a memory circuit associated with the receiver circuit 330 or 300. In some embodiments, the data compression metric D determined at the digital data compression circuit 314 during the digital mode is utilized by the analog data compression circuit 311 during the hybrid mode to perform compression. In some embodiments, the digital data compression circuit 314 comprises one or more components configured to determine the data compression metric D and to perform the compression operation. In some embodiments, the digital data compression circuit 314 may be implemented similar to the digital data compression circuit 214 in FIG. 2. For example, the digital data compression circuit 314 can comprise a compression parameter determination circuit (not shown) configured to determine the data compression metric D, a compression circuit configured to perform data compression and a quantization circuit configured to perform quantization of the compressed signals. In some embodiments, in the mixed architecture, the compression parameter determination circuit associated with the digital data compression circuit 314 may be further configured to generate the compression metric signal 319.

Upon determining the data compression metric D and performing data compression in the digital domain, the receiver circuit 300 in FIG. 3 is configured to switch to a hybrid mode of operation. In some embodiments, the receiver circuit is configured to switch from the digital mode of operation to the hybrid mode of operation based on an indication received in the feedback signal 317 from the baseband processor circuit 308. In some embodiments, the hybrid mode of operation of the receiver circuit 300 can be explained with reference to the receiver circuit 350 in FIG. 3b. In some embodiments, the receiver circuit 300 in FIG. 3 and the receiver circuit 350 in FIG. 3b are the same, and therefore, the same indexes are utilized to identify the various components and signals in FIG. 3 and FIG. 3b. In some embodiments, the receiver circuit 300 is configured to switch to the hybrid mode during a control/data reception phase associated with beamforming, as explained above with respect to FIG. 3. Referring to FIG. 3b, it can be seen that in mixed architecture, during the hybrid mode, the digital data compression circuit 314 is selectively deactivated and the analog data compression circuit 311 is selectively activated.

Referring again to FIG. 3b, the analog front-end circuit 310 is configured to receive a plurality of receive signals 303 from a plurality of antennas 304 respectively associated with the analog front-end circuit 310 and generate a plurality of analog receive signals 305 based thereon. In some embodiments, the plurality of analog receive signals 305 is equivalent to the plurality of receive signals 305 in FIG. 3a and comprises an analog signal dimension N associated therewith. In some embodiments, the analog signal dimension N is dictated by the number of antennas in the plurality of antennas 304. Referring again to FIG. 3b, since the analog data compression circuit 311 is activated during the hybrid mode, the analog data compression circuit 311 is configured to receive the plurality of analog receive signals 305 from the analog front-end circuit 310 and compress the plurality of analog receive signals 305 to generate one or more compressed analog data signals 307 based thereon.

In some embodiments, the one or more compressed analog data signals 307 comprises a compressed analog signal dimension K associated therewith. In some embodiments, the compressed digital signal dimension K refers to a number of compressed analog data signals in the one or more compressed analog data signals 307. In some embodiments, the compressed analog signal dimension K associated with the one or more compressed digital analog signals 307 is less than the analog signal dimension N associated with the plurality of analog receive signals 305. In some embodiments, the analog data compression circuit 311 is configured to generate the one or more compressed analog data signals 307 based on a compression operation that utilizes a data compression metric D, on the plurality of analog receive signals 305. In some embodiments, the data compression metric D dictates the compressed analog signal dimension K associated with the one or more compressed analog data signals 307.

Figure 3C:
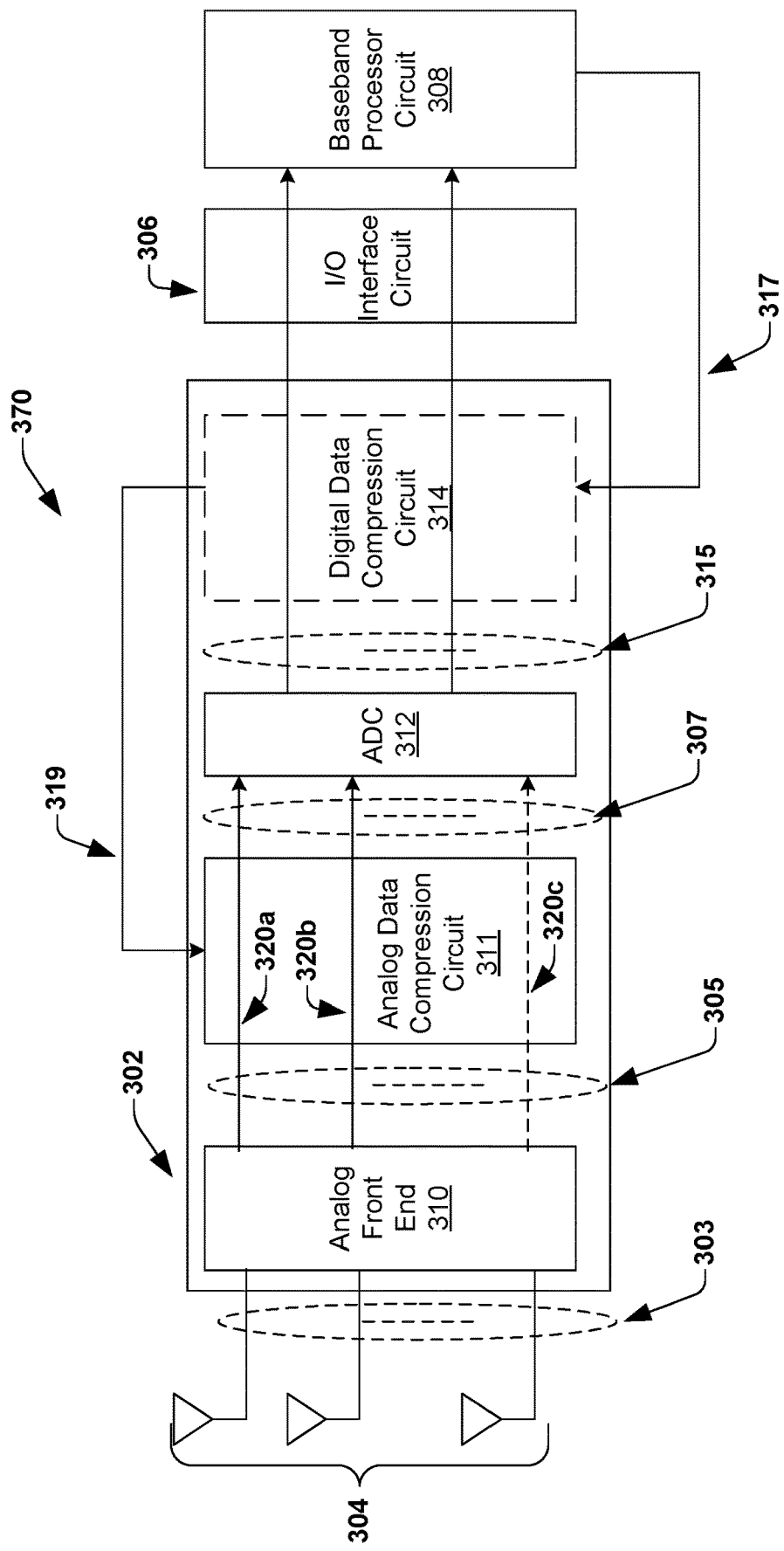
FIG. 3c illustrates another example implementation of the hybrid mode of operation of the receiver circuit in FIG. 3, according to one embodiment of the disclosure.

The compression of the plurality of analog receive signals 305 within the analog data compression circuit 311 can be implemented differently in different embodiments. For example, in one example embodiment, the compression within the analog data compression circuit 311 is implemented based on implementing a phase shifter circuit (not shown) configured to apply a phase offset to the plurality of analog receive signals 305, based on the data compression metric D, in order to generate the one or more compressed analog data signals 307. In such embodiments, the analog data compression circuit 311 can comprise one or more phase shifter circuits configured to receive the plurality of analog receive signals 305 and generate the one or more compressed analog data signals 307. Further, in another example embodiment, the compression within the analog data compression circuit 311 can be implemented by selectively activating or deactivating one or more of a plurality of receive chains coupled between the analog front-end circuit 310 and the ADC circuit 312, as shown in FIG. 3c. The receiver circuit 370 in FIG. 3c illustrates another way of implementation of the analog data compression circuit 311 in FIG. 3b. In such embodiments, the analog data compression circuit 311 may comprise a control circuit (not shown) configured to selectively activate or deactivate one or more of a plurality of receive chains 320a, 320b and 320c, thereby achieving the compression. In particular, in this embodiment, in order to achieve the compressed analog signal dimension of K associated with the one or more compressed analog data signals 307, N-K receive chains can be deactivated.

Referring back to FIG. 3b again, the ADC circuit 312 is coupled to the analog data compression circuit 311 and configured to digitize the one or more compressed analog data signals 307, in order to generate one or more compressed digital data signals 315. In some embodiments, the one or more compressed digital data signals 315 comprises a compressed digital signal dimension K same as the compressed analog signal dimension K, as no compression occurs in the digital domain during the hybrid mode. In some embodiments, the one or more compressed digital data signals 315 generated during the hybrid mode in FIG. 3b is equivalent to the one or more compressed digital data signals 313 generated during the digital mode in FIG. 3a. In some embodiments, the ADC circuit 312 in FIG. 3b is further configured to provide the one or more compressed digital data signals 315 to the I/O interface circuit 306. In some embodiments, the I/O interface circuit 306 is further configured to convey the one or more compressed digital data signals 315 to the baseband processor circuit 308, for further processing.

In some embodiments, the data compression metric D utilized in the hybrid mode is same as the data compression metric D determined at the digital data compression circuit 314, during the digital mode, as explained above. In some embodiments, utilizing the same data compression metric D, determined during the digital mode, in the analog data compression circuit 311 enables to eliminate the sector sweeping latency associated with the analog domain. Further, in some embodiments, utilizing the data compression metric D, determined during the digital mode, in the analog data compression circuit 311 enables to maintain the same performance both in the analog domain and the digital domain. That is, utilizing the same data compression metric D enables to obtain the same compressed signal dimension K both during the digital mode of operation and the hybrid mode of operation of the receiver circuit 300 in FIG. 3. Since in the analog domain, the in-phase components and the quadrature components are not accounted for the various signals associated therewith, a quantized version of the data compression metric D determined in the digital mode may be utilized in the hybrid mode. That is, in the digital mode, a data compression matrix D of size 2K×2S is utilized. However, in the hybrid mode, a quantized version of D, say D' having a size of K×S, may be utilized, in order to achieve the same level of compression as in the digital mode.

Figure 4:
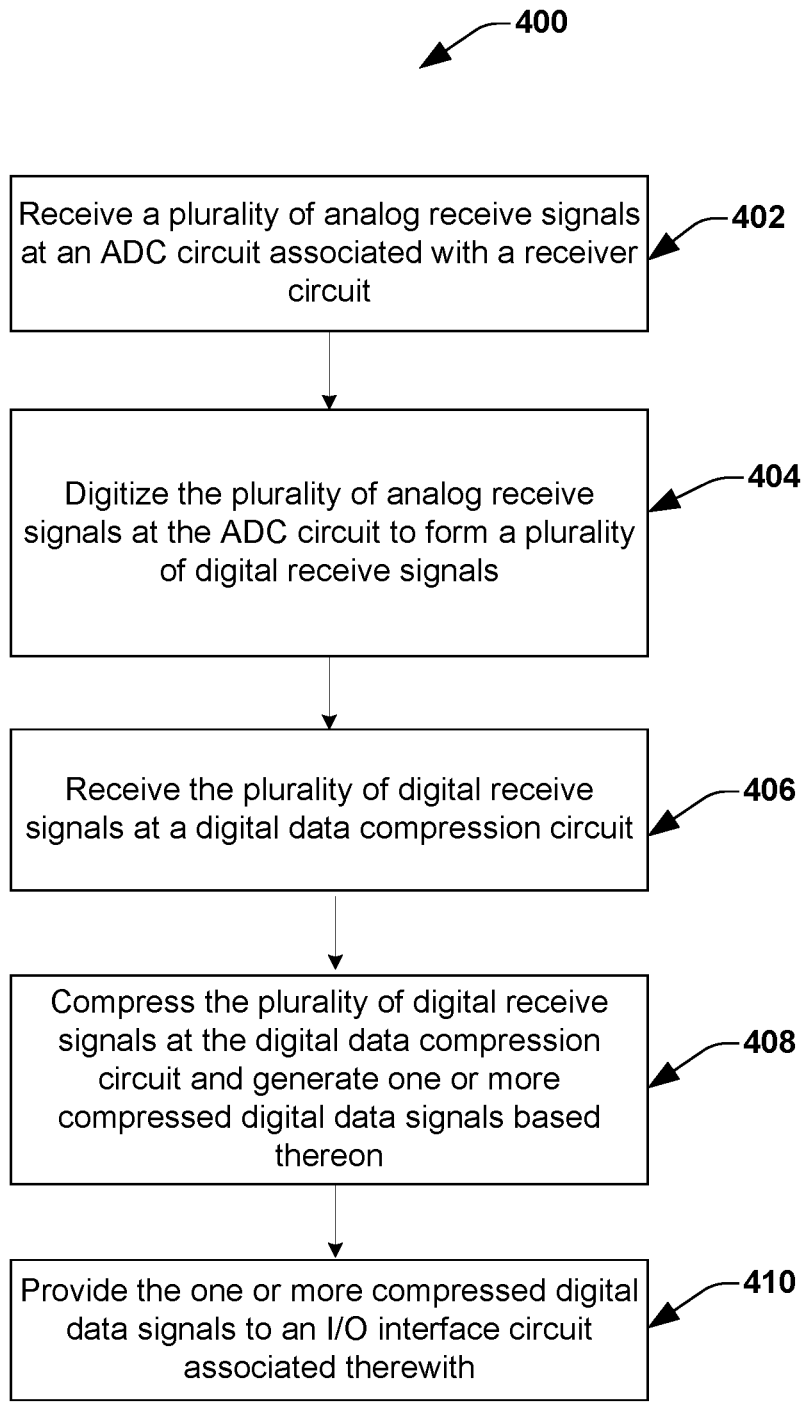
FIG. 4 illustrates a flow diagram of a method for applying data compression in digital domain in a receiver circuit, according to one embodiment of the disclosure.

FIG. 4 illustrates a flow diagram of a method 400 for applying data compression in digital domain in a receiver circuit, according to one embodiment of the disclosure. The method 400 is explained herein with reference to the receiver circuit 200 in FIG. 2. However, in other embodiments, the method 400 can be applied to other receiver circuits as well, for example, the receiver circuit 330 in FIG. 3a. At 402, a plurality of analog receive signals (e.g., the plurality of analog receive signals 205 in FIG. 2) is received at an ADC circuit (e.g., the ADC circuit 212 in FIG. 2) associated with a receiver circuit (e.g., the receiver circuit 200 in FIG. 2). At 404, the plurality of analog receive signals is digitized at the ADC circuit to form a plurality of digital receive signals (e.g., the plurality of digital receive signals 207 in FIG. 2). At 406, the plurality of digital receive signals is received at a digital data compression circuit (e.g., the digital data compression circuit 214 in FIG. 2). At 408, the plurality of digital receive signals is compressed at the digital data compression circuit, in order to generate one or more compressed digital data signals (e.g., the one or more compressed digital data signals 209 in FIG. 2).

In some embodiments, the plurality of digital receive signals is compressed at the digital data compression circuit based on a compression operation utilizing a data compression metric D, as explained with respect to FIG. 2 above. In some embodiments, the data compression metric D is determined at the digital data compression circuit, prior to the compression operation at 408 above. In some embodiments, a compressed digital signal dimension (e.g., the compressed digital signal dimension K in FIG. 2) associated with the one or more compressed digital data signals is less than a digital signal dimension (e.g., the digital signal dimension S in FIG. 2) associated with the plurality of digital receive signals. In some embodiments, the compressed digital signal dimension associated with the one or more compressed digital data signals is dictated by the data compression metric D. At 410, the one or more compressed digital data signals is provided from the digital data compression circuit to an I/O interface circuit (e.g., the I/O interface circuit 206 in FIG. 2) associated therewith.

Figure 5:
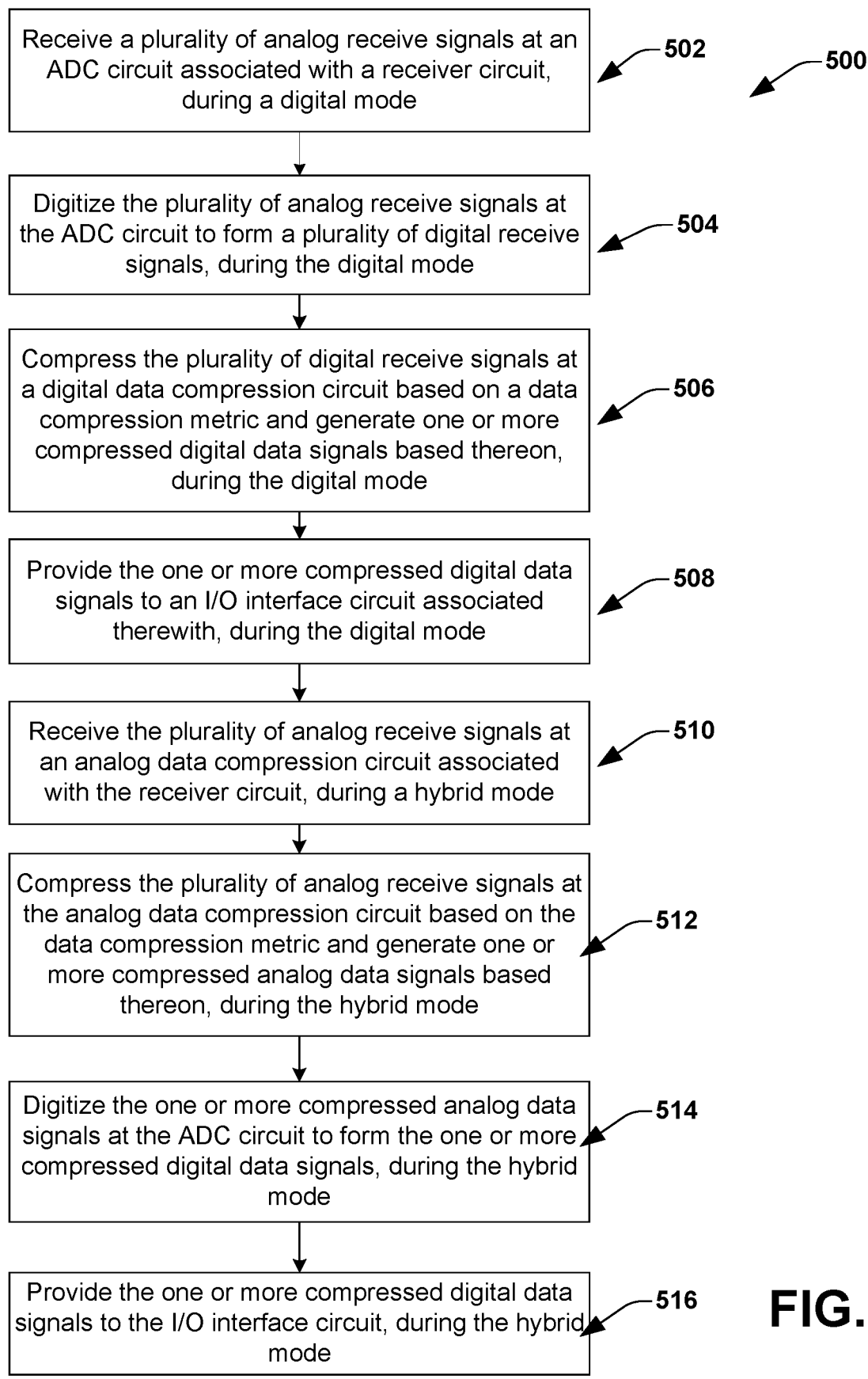
FIG. 5 illustrates a flow diagram of a method for applying data compression in a receiver circuit, according to one embodiment of the disclosure.

FIG. 5 illustrates a flow diagram of a method 500 for applying data compression in a receiver circuit, according to one embodiment of the disclosure. In some embodiments, the method 500 facilitates to apply data compression both in digital domain and in analog domain. The method 500 is explained herein with reference to the receiver circuit 330 in FIG. 3a (for compression in digital domain) and the receiver circuit 350 in FIG. 3b (for compression in the analog domain). However, in other embodiments, the method 500 can be applied to other receiver circuits as well. At 502, a plurality of analog receive signals (e.g., the plurality of analog receive signals 305 in FIG. 3a) is received at an ADC circuit (e.g., the ADC circuit 312 in FIG. 3a) associated with a receiver circuit (e.g., the receiver circuit 330 in FIG. 3a), during a digital mode. At 504, the plurality of analog receive signals is digitized at the ADC circuit to form a plurality of digital receive signals (e.g., the plurality of digital receive signals 309 in FIG. 3a). At 506, the plurality of digital receive signals is compressed at a digital data compression circuit (e.g., the digital data compression circuit 314 in FIG. 3a), to generate one or more compressed digital data signals (e.g., the one or more compressed digital data signals 313 in FIG. 3a).

In some embodiments, the digital data compression circuit is selectively activated during the digital mode of operation of the receiver circuit. In some embodiments, the plurality of digital receive signals is compressed at the digital data compression circuit based on a compression operation utilizing a data compression metric D, as explained with respect to FIG. 3 above. In some embodiments, the digital data compression circuit is further configured to determine the data compression metric D, prior to performing the compression operation. At 508, the one or more compressed digital data signals is provided from the digital data compression circuit to an I/O interface circuit (e.g., the I/O interface circuit 306 in FIG. 3a) associated therewith. At 510, the plurality of analog receive signals is received at an analog data compression circuit (e.g., the analog data compression circuit 311 in FIG. 3b) associated with a receiver circuit (e.g., the receiver circuit 350 in FIG. 3b), during a hybrid mode od operation associated with the receiver circuit. In some embodiments, the analog data compression circuit is selectively activated during the hybrid mode.

At 512, the plurality of analog receive signals is compressed at the analog data compression circuit to generate one or more compressed analog data signals (e.g., the compressed analog data signals 307 in FIG. 3b), during the hybrid mode. In some embodiments, the plurality of analog receive signals is compressed at the analog data compression circuit based on utilizing a data compression metric D. In some embodiments, the analog data compression circuit is configured to utilize the data compression metric D determined during the digital mode, in order to compress the plurality of analog receive signals. At 514, the one or more compressed analog data signals is digitized at the ADC circuit (e.g., the ADC circuit 312 in FIG. 3b) to form the one or more compressed digital data signals (e.g., the one or more compressed digital data signals 315 in FIG. 3b), during the hybrid mode. At 514, the one or more compressed digital data signals is provided from the ADC circuit to the I/O interface circuit (e.g., the I/O interface circuit 306 in FIG. 3b) associated therewith.

While the methods are illustrated, and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 6:
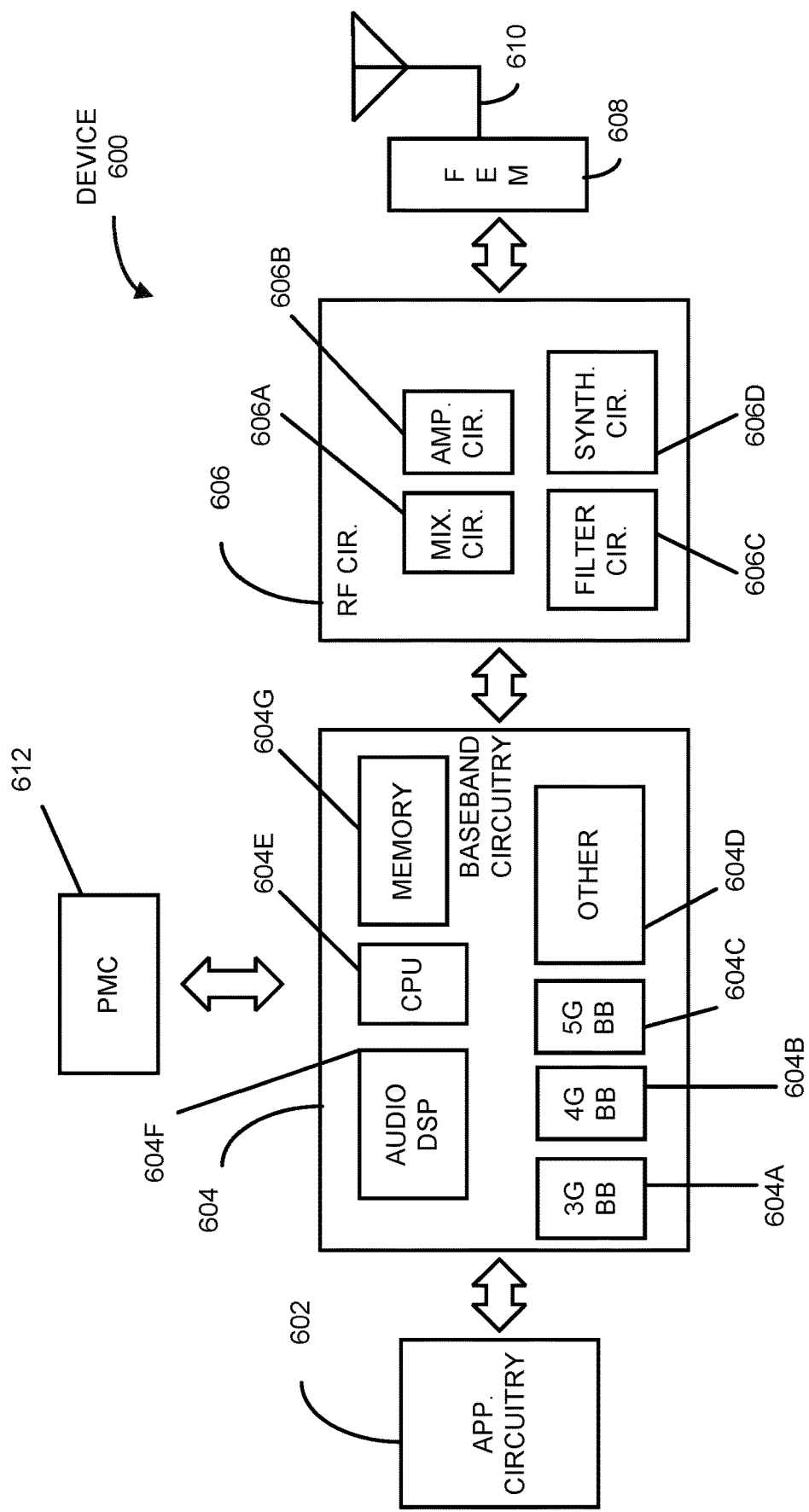
FIG. 6 illustrates example components of a device, in accordance with some embodiments.

FIG. 6 illustrates example components of a device 600 in accordance with some embodiments. In some embodiments, the device 600 may include application circuitry 602, baseband circuitry 604, Radio Frequency (RF) circuitry 606, front-end module (FEM) circuitry 608, one or more antennas 610, and power management circuitry (PMC) 612 coupled together at least as shown. The components of the illustrated device 600 may be included in a UE or a RAN node. In some embodiments, the receiver circuit 100, the receiver circuit 200 and the receiver circuit 300 could be implemented as a part of the device 600. In some embodiments, the device 600 may include less elements (e.g., a RAN node may not utilize application circuitry 602, and instead include a processor/controller to process IP data received from an EPC). In some embodiments, the device 600 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 602 may include one or more application processors. For example, the application circuitry 602 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 600. In some embodiments, processors of application circuitry 602 may process IP data packets received from an EPC.

The baseband circuitry 604 may include circuitry such as, but not limited to, one or more single-core or multi-core processors. The baseband circuitry 604 may include one or more baseband processors or control logic to process baseband signals received from a receive signal path of the RF circuitry 606 and to generate baseband signals for a transmit signal path of the RF circuitry 606. Baseband processing circuitry 604 may interface with the application circuitry 602 for generation and processing of the baseband signals and for controlling operations of the RF circuitry 606. For example, in some embodiments, the baseband circuitry 604 may include a third generation (3G) baseband processor 604A, a fourth generation (4G) baseband processor 604B, a fifth generation (5G) baseband processor 604C, or other baseband processor(s) 604D for other existing generations, generations in development or to be developed in the future (e.g., second generation (2G), si8h generation (6G), etc.). The baseband circuitry 604 (e.g., one or more of baseband processors 604A-D) may handle various radio control functions that enable communication with one or more radio networks via the RF circuitry 606. In other embodiments, some or all of the functionality of baseband processors 604A-D may be included in modules stored in the memory 604G and executed via a Central Processing Unit (CPU) 604E. The radio control functions may include, but are not limited to, signal modulation/demodulation, encoding/decoding, radio frequency shifting, etc. In some embodiments, modulation/demodulation circuitry of the baseband circuitry 604 may include Fast-Fourier Transform (FFT), precoding, or constellation mapping/demapping functionality. In some embodiments, encoding/decoding circuitry of the baseband circuitry 604 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 604 may include one or more audio digital signal processor(s) (DSP) 604F. The audio DSP(s) 604F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 604 and the application circuitry 602 may be implemented together such as, for example, on a system on a chip (SOC).

In some embodiments, the baseband circuitry 604 may provide for communication compatible with one or more radio technologies. For example, in some embodiments, the baseband circuitry 604 may support communication with an evolved universal terrestrial radio access network (EU-TRAN) or other wireless metropolitan area networks (WMAN), a wireless local area network (WLAN), a wireless personal area network (WPAN). Embodiments in which the baseband circuitry 604 is configured to support radio communications of more than one wireless protocol may be referred to as multi-mode baseband circuitry.

RF circuitry 606 may enable communication with wireless networks using modulated electromagnetic radiation through a non-solid medium. In various embodiments, the RF circuitry 606 may include switches, filters, amplifiers, etc. to facilitate the communication with the wireless network. RF circuitry 606 may include a receive signal path which may include circuitry to down-convert RF signals received from the FEM circuitry 608 and provide baseband signals to the baseband circuitry 604. RF circuitry 606 may also include a transmit signal path which may include circuitry to up-convert baseband signals provided by the baseband circuitry 604 and provide RF output signals to the FEM circuitry 608 for transmission.

In some embodiments, the receive signal path of the RF circuitry 606 may include mixer circuitry 606*a*, amplifier circuitry 606*b* and filter circuitry 606*c*. In some embodiments, the transmit signal path of the RF circuitry 606 may include filter circuitry 606*c* and mixer circuitry 606*a*. RF circuitry 606 may also include synthesizer circuitry 606*d* for synthesizing a frequency for use by the mixer circuitry 606*a* of the receive signal path and the transmit signal path. In some embodiments, the mixer circuitry 606*a* of the receive signal path may be configured to down-convert RF signals received from the FEM circuitry 608 based on the synthesized frequency provided by synthesizer circuitry 606*d*. The amplifier circuitry 606*b* may be configured to amplify the down-converted signals and the filter circuitry 606*c* may be a low-pass filter (LPF) or band-pass filter (BPF) configured to remove unwanted signals from the down-converted signals to generate output baseband signals. Output baseband signals may be provided to the baseband circuitry 604 for further processing. In some embodiments, the output baseband signals may be zero-frequency baseband signals, although this is not a requirement. In some embodiments, mixer circuitry 606*a* of the receive signal path may comprise passive mixers, although the scope of the embodiments is not limited in this respect.

In some embodiments, the mixer circuitry 606*a* of the transmit signal path may be configured to up-convert input baseband signals based on the synthesized frequency provided by the synthesizer circuitry 606*d* to generate RF output signals for the FEM circuitry 608. The baseband signals may be provided by the baseband circuitry 604 and may be filtered by filter circuitry 606*c*.

In some embodiments, the mixer circuitry 606*a* of the receive signal path and the mixer circuitry 606*a* of the transmit signal path may include two or more mixers and may be arranged for quadrature downconversion and upconversion, respectively. In some embodiments, the mixer circuitry 606*a* of the receive signal path and the mixer circuitry 606*a* of the transmit signal path may include two or more mixers and may be arranged for image rejection (e.g., Hartley image rejection). In some embodiments, the mixer circuitry 606*a* of the receive signal path and the mixer circuitry 606*a* may be arranged for direct downconversion and direct upconversion, respectively. In some embodiments, the mixer circuitry 606*a* of the receive signal path and the mixer circuitry 606*a* of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 606 may include analog-to-digital converter (ADC) and digital-to-analog converter (DAC) circuitry and the baseband circuitry 604 may include a digital baseband interface to communicate with the RF circuitry 606.

In some dual-mode embodiments, a separate radio IC circuitry may be provided for processing signals for each spectrum, although the scope of the embodiments is not limited in this respect.

In some embodiments, the synthesizer circuitry 606*d* may be a fractional-N synthesizer or a fractional N/N+1 synthesizer, although the scope of the embodiments is not limited in this respect as other types of frequency synthesizers may be suitable. For example, synthesizer circuitry 606*d* may be a delta-sigma synthesizer, a frequency multiplier, or a synthesizer comprising a phase-locked loop with a frequency divider.

The synthesizer circuitry 606*d* may be configured to synthesize an output frequency for use by the mixer circuitry 606*a* of the RF circuitry 606 based on a frequency input and a divider control input. In some embodiments, the synthesizer circuitry 606*d* may be a fractional N/N+1 synthesizer.

In some embodiments, frequency input may be provided by a voltage controlled oscillator (VCO), although that is not a requirement. Divider control input may be provided by either the baseband circuitry 604 or the applications processor 602 depending on the desired output frequency. In some embodiments, a divider control input (e.g., N) may be determined from a look-up table based on a channel indicated by the applications processor 602.

Synthesizer circuitry 606d of the RF circuitry 606 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 606d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 606 may include an IQ/polar converter.

FEM circuitry 608 may include a receive signal path which may include circuitry configured to operate on RF signals received from one or more antennas 610, amplify the received signals and provide the amplified versions of the received signals to the RF circuitry 606 for further processing. FEM circuitry 608 may also include a transmit signal path which may include circuitry configured to amplify signals for transmission provided by the RF circuitry 606 for transmission by one or more of the one or more antennas 610. In various embodiments, the amplification through the transmit or receive signal paths may be done solely in the RF circuitry 606, solely in the FEM 608, or in both the RF circuitry 606 and the FEM 608.

In some embodiments, the FEM circuitry 608 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 606). The transmit signal path of the FEM circuitry 608 may include a power amplifier (PA) to amplify input RF signals (e.g., provided by RF circuitry 606), and one or more filters to generate RF signals for subsequent transmission (e.g., by one or more of the one or more antennas 610).

In some embodiments, the PMC 612 may manage power provided to the baseband circuitry 604. In particular, the PMC 612 may control power-source selection, voltage scaling, battery charging, or DC-to-DC conversion. The PMC 612 may often be included when the device 600 is capable of being powered by a battery, for example, when the device is included in a UE. The PMC 612 may increase the power conversion efficiency while providing desirable implementation size and heat dissipation characteristics.

While FIG. 6 shows the PMC 612 coupled only with the baseband circuitry 604. However, in other embodiments, the PMC 8 12 may be additionally or alternatively coupled with, and perform similar power management operations for, other components such as, but not limited to, application circuitry 602, RF circuitry 606, or FEM 608.

In some embodiments, the PMC 612 may control, or otherwise be part of, various power saving mechanisms of the device 600. For example, if the device 600 is in an RRC_Connected state, where it is still connected to the RAN node as it expects to receive traffic shortly, then it may enter a state known as Discontinuous Reception Mode (DRX) after a period of inactivity. During this state, the device 600 may power down for brief intervals of time and thus save power.

If there is no data traffic activity for an extended period of time, then the device 600 may transition off to an RRC_Idle state, where it disconnects from the network and does not perform operations such as channel quality feedback, handover, etc. The device 600 goes into a very low power state and it performs paging where again it periodically wakes up to listen to the network and then powers down again. The device 600 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 602 and processors of the baseband circuitry 604 may be used to execute elements of one or more instances of a protocol stack. For example, processors of the baseband circuitry 604, alone or in combination, may be used execute Layer 3, Layer 2, or Layer 1 functionality, while processors of the application circuitry 604 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a receiver circuit associated with a communication device comprising a digital data compression circuit configured to receive a plurality of digital receive signals derived from a plurality of analog receive signals associated with the receiver circuit, respectively; and compress the plurality of digital receive signals to form one or more compressed digital data signals based thereon, to be provided to an input output (I/O) interface associated therewith, wherein a compressed digital signal dimension associated with the one or more compressed digital data signals is less than a digital signal dimension associated with the plurality of digital receive signals.

Example 2 is a circuit, including the subject matter of example 1, wherein the digital data compression circuit is configured to compress the plurality of digital receive signals, based on utilizing a data compression metric determined at the digital data compression circuit, wherein the data compression metric dictates the compressed digital signal dimension.

Example 3 is a circuit, including the subject matter of examples 1-2, including or omitting elements, wherein the digital data compression circuit comprises a compression parameter determination circuit configured to determine the data compression metric, at least in part, based on measurements associated with the plurality of the digital receive signals.

Example 4 is a circuit, including the subject matter of examples 1-3, including or omitting elements, wherein the compression parameter determination circuit is further configured to adaptively change the data compression metric in real-time, based on monitoring one or more parameters associated with the plurality of digital receive signals or based on a feedback signal from a baseband processor associated therewith, or both.

Example 5 is a circuit, including the subject matter of examples 1-4, including or omitting elements, wherein the digital data compression circuit further comprises a compression circuit configured to receive the plurality of digital receive signals; receive the data compression metric from the compression parameter determination circuit; and perform the compression operation on the plurality of digital receive signals based on utilizing the data compression metric, in order to generate the one or more compressed digital data signals.

Example 6 is a circuit, including the subject matter of examples 1-5, including or omitting elements, wherein the data compression circuit further comprises a quantization circuit configured to quantize the one or more compressed digital data signals, prior to providing the one or more compressed digital data signals to the I/O interface.

Example 7 is a circuit, including the subject matter of examples 1-6, including or omitting elements, further comprising an analog-to-digital converter (ADC) circuit configured to generate the plurality of digital signals based on digitizing the plurality of analog receive signals.

Example 8 is a circuit, including the subject matter of examples 1-7, including or omitting elements, further comprising an analog front-end circuit configured to receive the plurality of analog receive signals from a plurality of antennas, respectively associated therewith and provide the plurality of analog receive signals to the ADC circuit.

Example 9 is a circuit, including the subject matter of examples 1-8, including or omitting elements, wherein the digital data compression circuit is selectively activated during a digital mode associated with the receiver circuit and is selectively deactivated during a hybrid mode associated with the receiver circuit.

Example 10 is a circuit, including the subject matter of examples 1-9, including or omitting elements, further comprising an analog data compression circuit coupled between the analog front-end circuit and the ADC circuit, and selectively activated during the hybrid mode and configured, during the hybrid mode, to receive the data compression metric determined at the digital data compression circuit during the digital mode; and compress the plurality of analog receive signals from the analog front-end circuit based on the data compression metric, in order to generate one or more compressed analog data signals; wherein a compressed analog signal dimension associated with the one or more compressed analog data signals is less than the analog signal dimension associated with the plurality of analog receive signals and wherein the compressed analog signal dimension is dictated by the data compression metric.

Example 11 is a circuit, including the subject matter of examples 1-10, including or omitting elements, wherein the ADC circuit is further configured to receive the one or more compressed analog data signals from the analog data compression circuit and digitize the one or more compressed analog data signals, thereby generating the one or more compressed digital data signals, to be provided to the I/O interface associated therewith, during the hybrid mode.

Example 12 is method for a receiver circuit comprising receiving at a digital data compression circuit, a plurality of digital receive signals respectively derived from a plurality of analog receive signals associated with the receiver circuit; and compressing, at the digital data compression circuit, the plurality of digital receive signals to form one or more compressed digital data signals based thereon, to be provided to an input output (I/O) interface associated therewith, wherein a compressed digital signal dimension associated with the one or more compressed digital data signals is less than a digital signal dimension associated with the plurality of digital receive signals.

Example 13 is a method, including the subject matter of example 12, further comprising determining a data compression metric at the digital data compression circuit, wherein the data compression metric is utilized to compress the plurality of digital receive signals and wherein the data compression metric dictates the compressed digital signal dimension.

Example 14 is a method, including the subject matter of examples 12-13, including or omitting elements, further comprising adaptively changing the data compression metric at the digital data compression circuit, at least in part, based on measurements associated with the plurality of the digital receive signals.

Example 15 is a method, including the subject matter of examples 12-14, including or omitting elements, further comprising digitizing the plurality of analog receive signals at an analog-to-digital converter (ADC) circuit coupled to the digital data compression circuit, to form the plurality of digital receive signals, prior to receiving the plurality of digital receive signals at the digital data compression circuit.

Example 16 is a receiver circuit associated with a communication device comprising a digital data compression circuit configured to receive a plurality of digital receive signals derived from the plurality of analog receive signals associated with the receiver circuit; determine a data compression metric based on the plurality of digital receive signals; and compress the plurality of digital receive signals to form one or more compressed digital data signals to be provided to an input output (I/O) interface circuit associated therewith, based on a data compression metric, during a digital mode associated with the receiver circuit, wherein a compressed digital signal dimension associated with the one or more compressed digital data signals is less than a digital signal dimension associated with the plurality of digital receive signals, and wherein the compressed digital signal dimension is dictated by the data compression metric.

Example 17 is a method, including the subject matter of example 16, wherein the digital data compression circuit is selectively activated during the digital mode associated with the receiver circuit and is selectively deactivated during a hybrid mode associated with the receiver circuit.

Example 18 is a method, including the subject matter of examples 16-17, including or omitting elements, wherein the digital mode is activated during a long-term channel training phase associated with beamforming and the hybrid mode is activated during a control/data reception phase associated with beamforming.

Example 19 is a method, including the subject matter of examples 16-18, including or omitting elements, further comprising an analog-to-digital converter (ADC) circuit configured to digitize the plurality of analog receive signals to generate the plurality of digital receive signals and provide the plurality of digital receive signals to the digital data compression circuit, during the digital mode.

Example 20 is a method, including the subject matter of examples 16-19, including or omitting elements, further comprising an analog front-end circuit configured to receive the plurality of analog receive signals from a plurality of antennas, respectively associated with the receiver circuit and provide the plurality of the analog receive signals to the ADC circuit, during the digital mode.

Example 21 is a method, including the subject matter of examples 16-20, including or omitting elements, further comprising an analog data compression circuit coupled between the analog front-end circuit and the ADC circuit, and configured, during the hybrid mode, to receive the data compression metric determined at the digital data compression circuit during the digital mode; and compress the plurality of analog receive signals from the analog front-end circuit, based on the data compression metric, in order to generate one or more compressed analog data signals; wherein a compressed analog signal dimension associated with the one or more compressed analog data signals is less than the analog signal dimension associated with the plurality of analog receive signals and wherein the compressed analog signal dimension is dictated by the data compression metric.

Example 22 is a method, including the subject matter of examples 16-21, including or omitting elements, wherein the ADC circuit is further configured to receive the one or more compressed analog data signals from the analog data compression circuit and digitize the one or more compressed analog data signals, thereby generating the one or more compressed digital data signals, to be provided to the I/O interface associated therewith, during the hybrid mode Example 23 is a method, including the subject matter of examples 16-22, including or omitting elements, wherein the analog data compression circuit is configured to compress the plurality of analog receive signals based on deactivating one or more receive chains of a plurality of receive chains respectively utilized to convey the plurality of analog receive signals, in accordance with the data compression metric.

Example 24 is a method, including the subject matter of examples 16-23, including or omitting elements, wherein the analog data compression circuit is configured to compress the plurality of analog receive signals based on applying a phase offset on the plurality of analog receive signals by utilizing the data compression metric.

Example 25 is a method, including the subject matter of examples 16-24, including or omitting elements, wherein the digital mode and the hybrid mode are configured to repeat at predetermined time intervals, and wherein the digital data compression circuit is configured to adaptively change the data compression metric during the digital mode associated with each of the respective time intervals.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A receiver circuit associated with a communication device configured to operate in a digital mode or a hybrid mode, the receiver circuit comprising:
   an analog-to-digital converter (ADC) circuit configured to digitize a plurality of analog receive signals to generate plurality of digital receive signals;
   a digital data compression circuit coupled to the ADC circuit and configured to, during the digital mode
      receive the plurality of digital receive signals;
      determine a data compression metric based on the plurality of digital receive signals; and
      compress the plurality of digital receive signals based on the data compression metric to form one or more compressed digital data signals based thereon,
      wherein a compressed digital signal dimension associated with the one or more compressed digital data signals is dictated by the data compression metric and is less than a digital signal dimension associated with the plurality of digital receive signals;
      wherein the digital data compression circuit is selectively activated during the digital mode and is selectively deactivated during the hybrid mode; and
   an analog data compression circuit coupled to the ADC circuit, configured, during the hybrid mode, to:
      receive the data compression metric determined by the digital data compression circuit during the digital mode;
      compress the plurality of analog receive signals based on the data compression metric to generate one or more compressed analog data signals, wherein a number of compressed analog data signals is dictated by the data compression metric;
      provide the one or more compressed analog receive signals to the ADC circuit for conversion to a corresponding one or more compressed digital data signals;
      wherein the analog data compression circuit is selectively activated during the hybrid mode and is selectively deactivated during the digital mode; and
   an input output (I/O) interface circuit configured to receive the one or more compressed digital data signals, wherein a total number of signals received at the I/O interface circuit is less than a number of analog receive signals in the plurality of analog receive signals.

2. The receiver circuit of claim 1, wherein the digital data compression circuit comprises a compression parameter determination circuit configured to determine the data compression metric, at least in part, based on measurements associated with the plurality of digital receive signals.

3. The receiver circuit of claim 2, wherein the compression parameter determination circuit is further configured to adaptively change the data compression metric in real-time, based on monitoring one or more parameters associated with the plurality of digital receive signals or based on a feedback signal from a baseband processor associated therewith, or both.

4. The receiver circuit of claim 1, wherein the digital data compression circuit further comprises a quantization circuit configured to quantize the one or more compressed digital data signals, prior to providing the one or more compressed digital data signals to the I/O interface circuit.

5. The receiver circuit of claim 1, further comprising an analog front-end circuit configured to receive the plurality of analog receive signals from a plurality of antennas, respectively associated therewith and provide the plurality of analog receive signals to the ADC circuit.

6. The receiver circuit of claim 1, wherein the digital signal dimension refers to a number of digital receive signals in the plurality of digital receive signals, and wherein the compressed digital signal dimension refers to a number of compressed digital data signals in the one or more compressed digital data signals.

7. A method for a receiver circuit, comprising:
   during a digital mode of operation of the receiver circuit,
      activating a digital data compression circuit and deactivating an analog data compression circuit;
      receiving, at the digital data compression circuit, a plurality of digital receive signals respectively derived from a plurality of analog receive signals associated with the receiver circuit;
      determining a data compression metric based on the plurality of digital receive signals;
      compressing, at the digital data compression circuit, the plurality of digital receive signals based on the data compression metric to form one or more compressed digital data signals based thereon, wherein a compressed digital signal dimension associated with the one or more compressed digital data signals is dictated by the data compression metric and is less than a digital signal dimension associated with the plurality of digital receive signals;
   during a hybrid mode of operation of the receiver circuit,
      activating the analog data compression circuit and deactivating the digital data compression circuit;
      receiving, at the analog data compression circuit, the data compression metric determined by the digital data compression circuit during the digital mode of operation of the receiver circuit;
      compressing the plurality of analog receive signals based on the data compression metric to generate one or more compressed analog data signals, wherein a number of compressed analog data signals is dictated by the data compression metric; and
      providing the one or more compressed analog receive signals to an ADC circuit for conversion to a corresponding one or more compressed digital data signals; and
   receiving at an input output (I/O) interface circuit the one or more compressed digital data signals, wherein a total number of signals received at the I/O interface circuit is less than a number of analog receive signals in the plurality of analog receive signals.

8. The method of claim 7, further comprising adaptively changing the data compression metric at the digital data compression circuit, at least in part, based on measurements associated with the plurality of digital receive signals.

9. The method of claim 8, comprising adaptively changing the data compression metric in real-time, based on monitoring one or more parameters associated with the plurality of digital receive signals or based on a feedback signal from a baseband processor associated therewith, or both.

10. A receiver circuit associated with a communication device comprising:
   analog front-end circuit configured to receive a plurality of analog receive signals from a plurality of antennas, respectively associated with the receiver circuit, wherein the plurality of analog receive signals comprises an analog signal dimension associated therewith, wherein the analog signal dimension refers to the number of analog receive signals in the plurality of analog receive signals;

an analog-to-digital converter (ADC) circuit configured to receive the plurality of analog receive signals from the analog front end circuit and digitize the plurality of analog receive signals to generate the plurality of digital receive signals;

a digital data compression circuit selectively activated during a digital mode of operation of the receiver circuit and selectively deactivated during a hybrid mode of operation of the receiver circuit, the digital data compression circuit configured to, during the digital mode, receive a plurality of digital receive signals derived from a plurality of analog receive signals associated with the receiver circuit, wherein the plurality of digital receive signals comprises a digital signal dimension associated therewith, wherein the digital signal dimension refers to a number of digital receive signals in the plurality of digital receive signals;

determine a data compression metric based on the plurality of digital receive signals; and compress the plurality of digital receive signals to form one or more compressed digital data signals, based on the data compression metric, during a digital mode associated with the receiver circuit, wherein the one or more compressed digital data signals comprises a compressed digital signal dimension associated therewith, wherein the compressed digital signal dimension refers to a number of compressed digital data signals in the one or more compressed digital data signals, wherein the compressed digital signal dimension associated with the one or more compressed digital data signals is less than the digital signal dimension associated with the plurality of digital receive signals, and wherein the compressed digital signal dimension is dictated by the data compression metric; and an analog data compression circuit coupled between the analog front-end circuit and the ADC circuit, the analog data compression circuit selectively activated during the hybrid mode of operation of the receiver circuit and selectively deactivated during the digital mode of operation of the receiver circuit, the analog data compression circuit configured to, during the hybrid mode, receive the data compression metric determined at the digital data compression circuit during the digital mode, compress the plurality of analog receive signals from the analog front-end circuit, based on the data compression metric, in order to generate one or more compressed analog data signals, wherein the one or more compressed analog data signals comprises a compressed analog signal dimension associated therewith, wherein the compressed analog signal dimension refers to a number of compressed analog data signals in the one or more compressed analog data signals, wherein the compressed analog signal dimension associated with the one or more compressed analog data signals is less than the analog signal dimension associated with the plurality of analog receive signals and wherein the compressed analog signal dimension is dictated by the data compression metric, and provide the one or more compressed analog data signals to the ADC circuit, wherein the ADC circuit is configured to digitize the one or more compressed analog data signals to generate a corresponding one or more compressed digital data signals; and an input output (I/O) interface circuit configured to receive the one or more compressed digital data signals, wherein a total number of signals received at the I/O interface circuit is less than a number of analog receive signals in the plurality of analog receive signals.

11. The receiver circuit of claim 10, wherein the digital mode is activated during a long-term channel training phase associated with beamforming and the hybrid mode is activated during a control/data reception phase associated with beamforming.

12. The receiver circuit of claim 10, wherein the analog data compression circuit is configured to compress the plurality of analog receive signals based on deactivating one or more receive chains of a plurality of receive chains respectively utilized to convey the plurality of analog receive signals, in accordance with the data compression metric.

13. The receiver circuit of claim 10, wherein the analog data compression circuit is configured to compress the plurality of analog receive signals based on applying a phase offset on the plurality of analog receive signals by utilizing the data compression metric.

14. The receiver circuit of claim 10, wherein the digital mode and the hybrid mode are configured to repeat at predetermined time intervals, and wherein the digital data compression circuit is configured to adaptively change the data compression metric during the digital mode associated with each of the respective time intervals.

\* \* \* \* \*